United States Patent
Lee et al.

(10) Patent No.: US 6,898,139 B2
(45) Date of Patent: May 24, 2005

(54) INTEGRATED CIRCUIT MEMORY DEVICES AND OPERATING METHODS THAT ARE CONFIGURED TO OUTPUT DATA BITS AT A LOWER RATE IN A TEST MODE OF OPERATION

(75) Inventors: Jae-woong Lee, Kyungki-do (KR); Chi-wook Kim, Kyungki-do (KR); Sang-seok Kang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/773,024

(22) Filed: Feb. 5, 2004

(65) Prior Publication Data

US 2004/0246801 A1 Dec. 9, 2004

(30) Foreign Application Priority Data

Jun. 4, 2003 (KR) ................................ 10-2003-0035906

(51) Int. Cl.$^7$ ................................................. G11C 7/00
(52) U.S. Cl. ........................ 365/221; 365/219; 365/201; 365/233
(58) Field of Search ................................. 365/221, 219, 365/201, 233

(56) References Cited

U.S. PATENT DOCUMENTS

| | | | |
|---|---|---|---|
| 5,933,379 A | 8/1999 | Park et al. | |
| 6,163,491 A | 12/2000 | Iwamoto et al. | |
| 6,212,113 B1 | 4/2001 | Maeda | |
| 6,301,182 B1 * | 10/2001 | Tanaka | ........................ 365/221 |

\* cited by examiner

*Primary Examiner*—Huan Hoang
(74) *Attorney, Agent, or Firm*—Myers Bigel Sibley & Sajovec

(57) ABSTRACT

Integrated circuit memory devices include a memory cell array that is configured to output data bits in parallel at a first data rate. An output circuit is configured to serially output the data bits to an external terminal at the first data rate in a normal mode of operation, and to serially output the data bits to the external terminal at a second data rate that is lower than the first data rate in a test mode of operation. Accordingly, the memory cell array can operate at a first data rate while allowing the output circuit to output data to an external terminal at a second data rate that is lower than the first data rate, in a test mode of operation.

32 Claims, 16 Drawing Sheets

INTEGRATED CIRCUIT MEMORY DEVICES AND OPERATING METHODS THAT ARE CONFIGURED TO OUTPUT DATA BITS AT A LOWER RATE IN A TEST MODE OF OPERATION

RELATED APPLICATION

This application claims the benefit of Korean Patent Application No. 2003-0035906, filed Jun. 4, 2003, the disclosure of which is hereby incorporated herein by reference in its entirety as if set forth fully herein.

FIELD OF THE INVENTION

This invention relates to integrated circuit memory devices and operational methods therefor, and more specifically to circuits and methods for testing integrated circuit devices.

BACKGROUND OF THE INVENTION

Integrated circuit memory devices are widely used in many commercial and consumer applications. One widely used integrated circuit memory device is a Dynamic Random Access Memory (DRAM). Synchronous DRAM (SDRAM) devices also have been designed, which are capable of reading and writing data in synchronism with the rising edge or falling edge of a clock signal. Moreover, Dual Data Rate (DDR) SDRAM devices also have been designed which can operate at a higher frequency than a conventional SDRAM (also referred to as a Single Data Rate (SDR) SDRAM) by reading and/or writing data in response to both the rising edge and the falling edge of a clock signal. It will be understood by those having skill in the art that as used herein, the term "data rate" means the number of bits transferred to or from an external input/output terminal by a memory device, in a clock cycle.

FIG. 1 is a timing diagram that compares operation of a conventional SDR SDRAM and a conventional DDR SDRAM. Both of these SDRAMs include a Burst Length (BL) of 4 and a Column Address Strobe (CAS) latency (CL) of 2. Thus, as shown in FIG. 1, for the SDRAM having BL=4 and CL=2, 4 bits of data Q0, Q1, Q2 and Q3 are read in response to a read command R where each bit of data Q0–Q3 is output in response to the rising edge of a clock CLK. Similarly, in response to a write command W, 4 bits of data are input sequentially in response to the rising edge of the clock CLK.

In contrast, as also shown in FIG. 1, for a DDR SDRAM, stored data Q0–Q3 is output from the memory device in response to both the rising edge and the falling edge of a data strobe signal (DQS) which itself is generated from the clock signal CLK. Also, in response to a write command, data D0–D3 is written into the memory device in response to both the rising and falling edges of DQS, so that a double data rate is obtained compared to the SDR SDRAM. The design and operation of SDRAM devices, including SDR SDRAM devices and DDR SDRAM devices, are well known to those having skill in the art and need not to be described further herein.

Due to the high data rates, it may be difficult to test a high frequency memory device such as a DDR SDRAM. It also may be particularly difficult to test a high frequency memory device such as a DDR SDRAM using relatively low frequency test equipment, such as test equipment that is designed to test an SDR SDRAM. For example, U.S. Pat. No. 5,933,379 to Park et al, assigned to the assignee of the present application, provides a "Method and Circuit for Testing a Semiconductor Memory Device Operating at High Frequency", as noted in the Park et al. title. As noted in the Park et al. Abstract, a circuit for testing a semiconductor memory device comprises a latency controller for controlling the latency of the external clock signal, an internal column address generator for generating a column address signal in the memory device, and a mode register for generating a mode signal. The circuit for testing semiconductor memory devices also includes a column address decoder for decoding the output address signal of the internal column address generator, a memory cell for reading or writing data, an input/output control unit for controlling the data input/output of the memory cell according to the output signal of the latency controller, a data input buffer, and a data output buffer. Further provided are a frequency multiplier for generating an internal clock signal having a frequency "n" times the frequency of the external clock signal. By providing the above-mentioned improvements, the conventional test equipment can be used to test high frequency memory devices.

U.S. Pat. No. 6,163,491 to Iwotomo et al. describes a "Synchronous Semiconductor Memory Device Which Can Be Inspected Even With Low Speed Tester" as noted in the Iwotomo et al. title. As noted in the Iwotomo et al. Abstract, a synchronous semiconductor memory device includes a prefetch selector receiving first and second data respectively read from first and second memory cells corresponding to even and odd addresses for outputting them to a data input/output terminal. The prefetch selector sequentially outputs first and second data to the data input/output terminal in one period of a clock period in the normal operation, determines if the first and second data match in a test mode, and outputs the determination result to the data input/output terminal in one period of the clock period.

Finally, U.S. Pat. No. 6,212,113 to Mader describes a "Semiconductor Memory Device Input Circuit" as noted in the Mader titled. As noted in the Mader Abstract, a double-data rate (DDR) memory device is disclosed that can be configured for testing on an ordinary memory tester. The DDR memory may include a DDR input circuit, a single data rate input circuit, a word line control circuit, a bit line control circuit, and a memory cell array. Normal write operations may be performed by selecting the DDR input circuit. Test write operations may be performed by selecting the SDR input circuit. Such an arrangement can enable a DDR memory device to be tested in an ordinary SDR memory tester It may also be difficult to test a high frequency memory device such as a DDR SDRAM because the high frequency memory device may have a relatively small valid data window margin, which may be caused by process variations in the device fabrication line. Thus, even though a high frequency device such as a DDR SDRAM may be tested with high frequency test equipment for a DDR SDRAM, it may be difficult to actually test multiple DDR SDRAM devices in parallel.

SUMMARY OF THE INVENTION

Some embodiments of the present invention provide integrated circuit memory devices that include a memory cell array that is configured to output a plurality of data bits in parallel at a first data rate. An output circuit is configured to serially output the plurality of data bits to an external terminal at the first data rate in a normal mode of operation, and to serially output the plurality of data bits to the external terminal at a second data rate that is lower than the first data rate in a test mode of operation. In some embodiments the memory cell array is responsive to a clock signal having rising and falling edges, wherein the first data rate is produced in response to both the rising edge and the falling rate of the clock signal and wherein the second data rate is produced in response to only one of the rising edge or the falling edge of the clock signal. In other embodiments, the memory cell array is configured to output the plurality of data bits and parallel at the first data rate over a corresponding plurality of first data lines and the output circuit is configured to serially output the plurality of data bits to the external terminal at the first data rate in the normal mode of operation over a corresponding plurality of second data lines, and to serially output the plurality of data-bits to the external terminal at the second data rate that is lower than the first data rate over the corresponding plurality of second data lines in the test mode of operation.

Accordingly, some embodiments of the present invention can allow the memory cell array to operate at a first data rate while allowing the output circuit to output data to an external terminal at a second data rate that is lower than the first data rate, in a test mode of operation. A DDR SDRAM, for example, can thereby be tested by SDR SDRAM test equipment and/or multiple SDR SDRAM devices may be tested in parallel on SDR SDRAM test equipment, because the data window is enlarged.

In some embodiments of the present invention, the output circuit is configured to replicate a first portion of the plurality of data bits that are output from the memory cell array in parallel to thereby serially output the first portion of the plurality of data bits to the external terminal at the second data rate that is lower than the first data rate, and to replicate a second portion of the plurality of data bits that are output from the memory cell array in parallel to thereby serially output the second portion of the plurality of data bits to the external terminal at the second data rate that is lower than the first data rate in the test mode of operation. More specifically, in some of these embodiments the memory cell array is configured to output the plurality of data bits in parallel at the first data rate over a corresponding plurality of first data lines, and the output circuit comprises a multiplexer that is configured to multiplex read data on the first data lines onto a corresponding plurality of second data lines and an output buffer that is configured to serially output data on the second data lines to the external terminal.

In some of these embodiments, the multiplexer is configured to couple a respective first data line to a respective second data line in the normal mode of operation, to couple respective even first data lines to respective even second data lines and to respective adjacent odd second data lines in a first submode of the test mode of operation, and to couple respective odd first data lines to respective odd second data lines and to respective adjacent even second data lines in a second submode of the test mode of operation. It will be understood that, as used herein, the terms "even" and "odd" are used to denote alternating data lines, regardless of the data line number designation that is used to connote the data line. In some embodiments, the multiplexer comprises a first switch that is configured to couple a respective even first data line to a respective even second data line in the first submode, a second switch that is configured to couple a respective odd first data line to a respective odd second data line in the second submode, and an equalizing circuit that is configured to couple a respective odd second data line to a respective adjacent even second data line in the first and second submodes. A mode register set also may be provided, that is responsive to a plurality of command signals and is configured to generate first and second test mode signals to place the multiplexer in the first and second submodes, respectively, of the test mode of operation.

In other embodiments, the multiplexer is configured to couple a respective first data line to a respective second data line in the normal mode of operation, to couple a respective first data line to a respective second data line in a first submode of the test mode of operation, and to cross-couple respective odd and even first data lines to respective even and odd second data lines in a second submode of the test mode of operation. In these embodiments, the output buffer may be responsive to a first internal clock signal that is generated in response to the rising edge of the clock signal and to a second internal clock signal that is generated in response to the falling edge of the clock signal in the normal mode of operation, and may be responsive to only one of the first internal clock signal or the second internal clock signal in the first and second submodes of the test mode of operation. It will be understood that, as used herein, "rising" and "falling" are used to denote different edges of a clock signal, and may be interchanged.

Moreover, in these embodiments, the multiplexer may comprise a first switch that is configured to couple a respective first data line to a respective second data line in the normal mode and in the first submode and a second switch that is configured to cross-couple respective odd and even first data lines to respective even and odd second data lines in the second submode. Also in some embodiments, the output buffer comprises a corresponding plurality of registers, a respective one of which is configured to store read data from a respective first data line, and a latch that is associated with a respective pair of adjacent registers, a respective latch being configured to latch data from a first adjacent register in response to the first internal clock signal and to latch data from a second adjacent register in response to the second internal clock signal. The output buffer may also include a parallel-to-serial converter that is responsive to the latches, to the first and second clock signals in the normal mode of operation, and to only one of the first and second internal clock signals during both the first and second submodes of operation.

In still other embodiments of the present invention, the output circuit is responsive to a first internal clock signal that is generated in response to the rising edge of the clock signal and to a second internal clock signal that is generated in response to the falling edge of the clock signal in the normal mode of operation, and is alternatingly responsive to the first internal clock signal and the second internal clock signal in the test mode of operation. More specifically, in some embodiments, the memory cell array is configured to output the plurality of data bits in parallel at the first data rate over a corresponding plurality of first data lines and the output circuit comprises an output buffer as configured to serially output data to the external terminal.

In some embodiments, the output buffer is responsive to a first internal clock signal that is generated in response to the rising edge of the clock signal and to a second internal clock signal that is generated in response to the falling edge of the clock signal in the normal mode of operation, and is responsive to only one of the first internal clock signal or the second internal clock signal in a first submode of the test mode of operation and is responsive to only the other of the first internal clock signal or the second clock signal in a second submode of the test mode of operation. In some embodiments, the output buffer comprises a corresponding plurality of registers, a respective one of which is configured to store read data from a respective first data line, a latch that is associated with a respective pair of adjacent registers, a respective latch being configured to latch data from a first adjacent register in response to the first internal clock signal and to latch data from a second adjacent register in response to the second internal clock signal. A parallel-to-serial converter is responsive to the latches and to the first and second internal clock signals in the normal mode of operation, to only one of the first and second internal clock signals during the first submode of operation, and to only the other of the first and second internal clock signals during the second submode of operation.

According to yet other embodiments of the present invention, the output circuit is responsive to a first internal clock signal that is generated in response to the rising edge of the clock signal and to a second internal clock signal that is generated in response to the falling edge of the clock signal in the normal mode of operation, and is responsive to a divided first internal clock signal that is generated from the first internal clock signal, and to a divided second internal clock signal that is generated from the second internal clock signal, in a test mode of operation. More specifically, in some embodiments, the output buffer is responsive to a first internal clock signal that is generated in response to the rising edge of the clock signal and to a second internal clock signal that is generated in response to the falling edge of the clock signal in the normal mode of operation, and is responsive to a divided first internal clock signal and a divided second-internal clock signal in the test mode of operation. In some embodiments, the divided first internal clock signal and the divided second internal clock signal are of half the frequency of the first internal clock signal and second internal clock signal.

Moreover, a first dividing circuit may be provided that is configured to generate the divided first internal clock signal in response to the rising edge of the clock signal and the test mode select signal. A second dividing circuit may be provided that is configured to generate the first internal clock signal in response to the falling edge of the clock signal and the test mode select signal. In some embodiments, the first dividing circuit comprises a first divider that is responsive to the rising edge of the clock signal and the test mode signal. The second dividing circuit comprises a second divider that is responsive to the falling edge of the clock signal and the test mode signal, and a delay element that is responsive to the second divider.

Other embodiments of the present invention provide methods of operating an integrated circuit memory device having a memory cell array that is configured to output a plurality of data bits in parallel at a first data rate. According to some embodiments of the present invention, the plurality of data bits is serially output from the memory cell array to an external terminal at the first data rate in a normal mode of operation. The plurality of data bits are serially output from the memory cell array to the external terminal at a second data rate that is lower than the first data rate in a test mode of operation. Analogous embodiments to those which were described above also may be provided in methods according to embodiments of the present invention.

DETAILED DESCRIPTION

Figure 1:
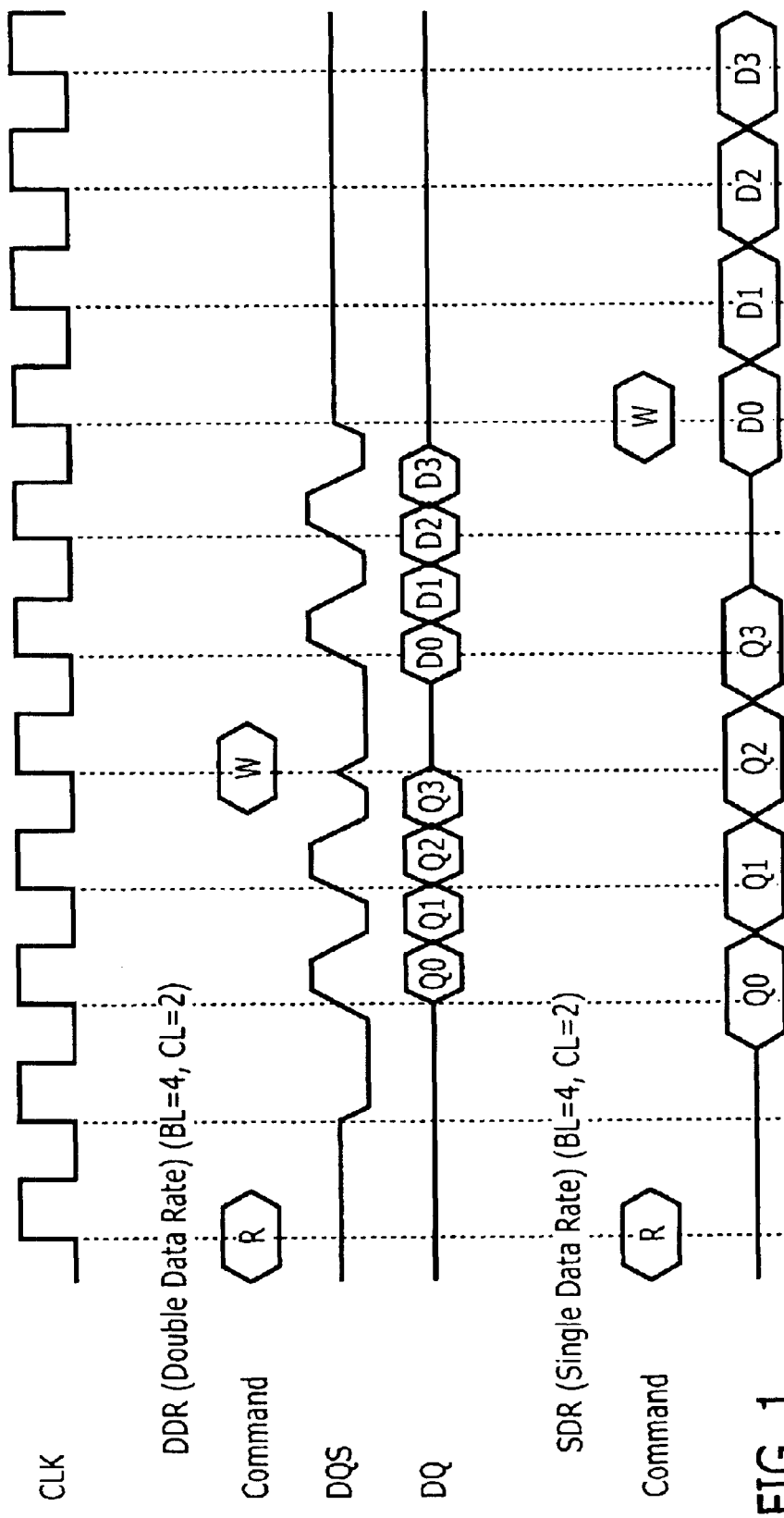
FIG. 1 is a timing diagram of operations that may be performed by conventional double data rate and single data rate memory devices.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of elements may be exaggerated for clarity. Moreover, each embodiment described and illustrated herein includes its complementary conductivity type embodiment as well. Like numbers refer to like elements throughout.

Figure 2:
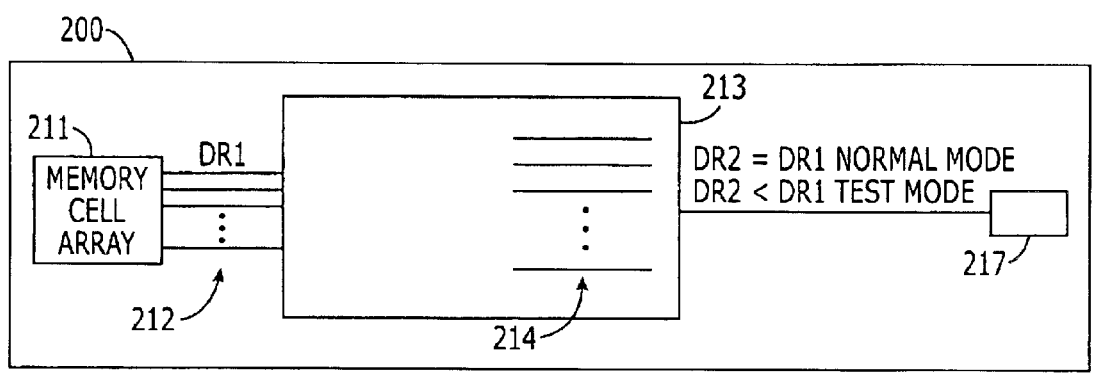
FIG. 2 is a block diagram of integrated circuit memory devices and operating methods according to embodiments of the present invention.

FIG. 2 is a block diagram of integrated memory devices and operating methods according to various embodiments of the present invention. As shown in FIG. 2, an integrated circuit memory device 200 includes a memory cell array 211 that is configured to output a plurality of data bits in parallel at a first data rate DR1. The design of memory cell array 211 is well known to those having skill in the art and need not be described further herein.

Still referring to FIG. 2, an output circuit 213 is configured to serially output the plurality of data bits to an external terminal 217 at the first data rate DR1 in a normal mode of operation, and to serially output the plurality of data bits to the external terminal 217 at a second data rate DR2 that is lower than the first data rate, in a test mode of operation. In other words, as shown in FIG. 2, DR2 is less than DR1. It will be understood by those having skill in the art that, in some embodiments of the present invention, a plurality of memory cell arrays 211, a plurality of output circuits 213 and/or a plurality of external terminals 217 may be provided in a single integrated circuit memory device 200. Moreover, the functionality and circuitry of the output circuit 213 may be replicated for each memory cell array 211 and/or external terminal 217 and/or may be at least partially shared among a plurality of memory cell arrays 211 and/or external terminals 217.

Still referring to FIG. 2, in some embodiments of the present invention, the memory cell array 211 is configured to output the plurality of data bits in parallel at the first data rate DR1, over a corresponding plurality of first data lines 212. Thus, there is one first data line 212 for each bit that is output in parallel from the memory cell array. Moreover, in some embodiments, the output circuit 213 is configured to serially output the plurality of data bits to the external terminal 217 at the first data rate in a normal mode of operation using a corresponding plurality of second data lines 214 in the output circuit 213, and to serially output the plurality of data bits to the external terminal 217 at the second data rate DR2 that is lower than the first data rate DR1, using the corresponding plurality of second data lines 214 in the output circuit, in the test mode of operation. Thus, for example, four first data lines 212 and four second data lines 214 may be used.

Figure 3:
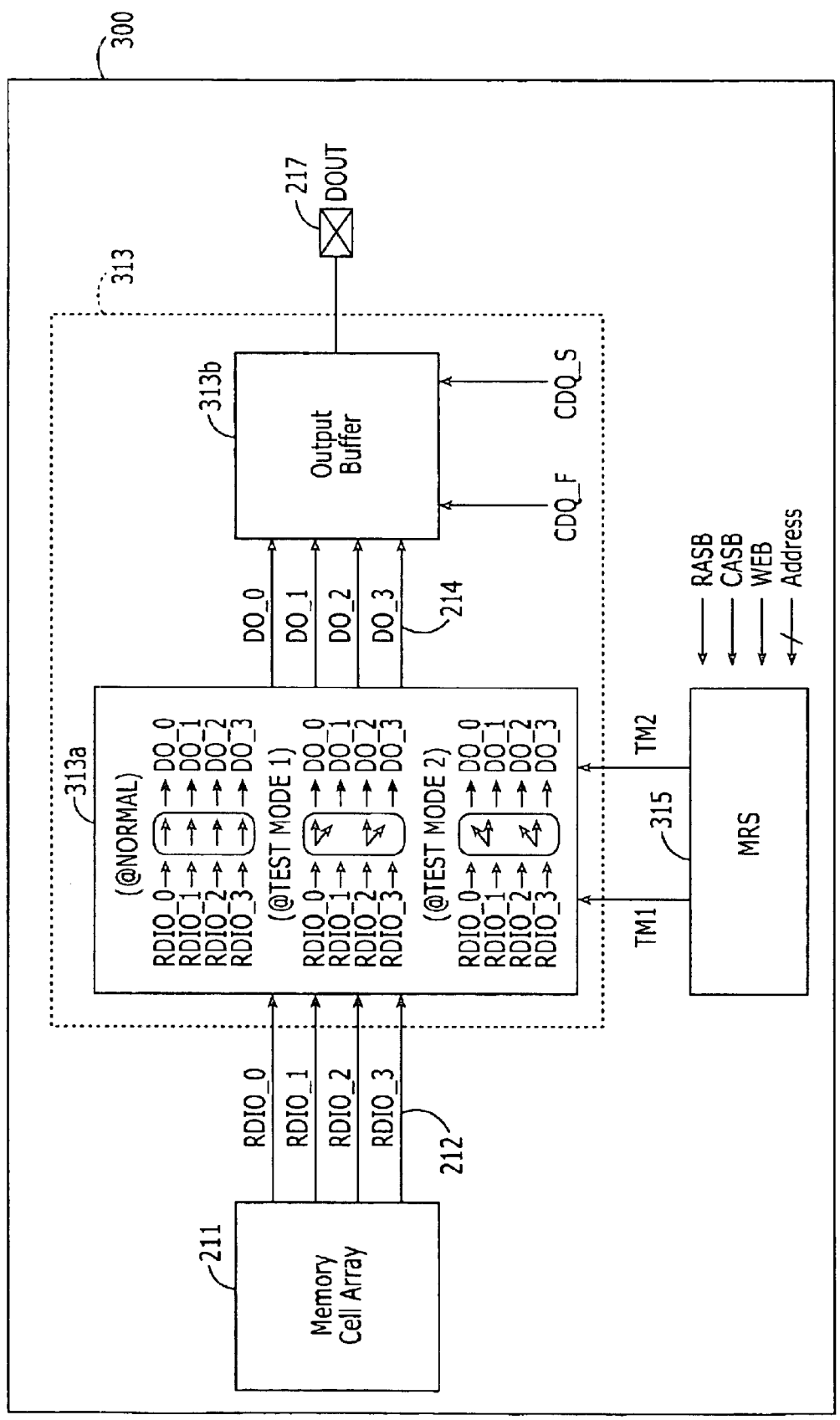
FIG. 3 is a block diagram of integrated circuit memory devices and operating methods according to other embodiments of the present invention.

FIG. 3 is a block diagram of integrated circuit memory devices and operating methods according to some embodiments of the present invention. In general, referring to FIG. 3, an output circuit 313 is configured to replicate a first portion of the plurality of data bits that are output from the memory cell array 211 in parallel to thereby serially output the first portion of the plurality of data bits to the external terminal 217 at the second data rate that is lower than the first data rate in the test mode of operation. The output circuit 313 is also configured to replicate a second portion of the plurality of data bits that are output from the memory cell array 211 in parallel to thereby serially output the second portion of the plurality of data bits to the external terminal at the second data rate that is lower than the first data rate, in the test mode of operation.

More specifically, as shown in FIG. 3, the memory cell array 211 is configured to output the plurality of data bits in parallel at the first data rate over a corresponding plurality of first data lines 212. In FIG. 3, the first data lines 212 are labeled RDIO_0–RDIO_3. However, fewer or greater numbers of first data lines 212 may be used in other embodiments. Moreover, as shown in FIG. 3, the output circuit 313 comprises a multiplexer 313a that is configured to multiplex read data on the first data lines 212 onto a corresponding plurality of second data lines 214, labeled in FIG. 3 as DO_0–DO_3. The output circuit 313 also comprises an output buffer 313b that is configured to serially output data on the second data lines DO_0–DO_3 to the external terminal 217. Again, only four second data lines 214 are shown in FIG. 3. However, a fewer or a greater number of second data lines may be used.

Even more specifically, as shown in FIG. 3, the multiplexer 313 is configured to couple a respective first data line 212 to a respective second data line 214 in the normal mode of operation, as shown at the top third of the multiplexer 313a, to couple respective even first data lines to respective even second data lines and to respective adjacent odd second data lines in a first submode of the test mode of operation, also referred to as Test Mode 1 and shown in the middle third of the multiplexer 313a, and to couple respective odd first data lines to respective odd second data lines and to respective adjacent even second data lines in a second submode of the test mode of operation, also referred to as Test Mode 2 and illustrated at the bottom third of the multiplexer 313a. It will also be understood that more than two test modes also may be supported.

Accordingly, as shown in FIG. 3, in a normal mode of operation, first data lines RDIO are coupled to corresponding second data lines DO to provide output from the output buffer 313 at a first data rate such as a DDR SDRAM data rate.

During the first test mode or first submode, data from even first data lines RDIO_0 and RDIO_2 are replicated on both the even and odd second data lines DO_0–DO_3 so that this data is provided to the output buffer 313b in replicated form and is thereby output to the external terminal 217 at a second data rate that is lower than the first data rate, such as an SDR SDRAM data rate. Finally, in a second test mode or second submode, data on odd first data lines RDIO_1 and RDIO_3 is replicated on to both the odd and even second data lines DO_0–DO_3 to thereby provide this data to the output buffer 313b at the second data rate that is lower than the first data rate. In the test mode, the data window of output data DOUT of the output buffer 313b is thereby enlarged and in some embodiments doubled, compared to the data window of data that is read out from the memory cell array 211. A DDR SDRAM can thereby be tested by DDR SDRAM test equipment and/or multiple SDR SDRAM test equipment because the data window has been enlarged.

Still referring to FIG. 3, a Mode Register Set (MRS) 315 is responsive to a plurality of command signals and is configured to generate first and second test mode signals TM1, TM2, to place the multiplexer 313a in the first and second submodes, respectively, of the test mode of operation. The command signals can include a Row Address Strobe signal (RASB), a Column Address Strobe signal (CASB), a Write Enable signal (WEB), and address signals. Since the MRS 315 is provided in the integrated circuit memory device 300 according to some embodiments of the present invention, testing may be conducted after packaging.

Figure 4:
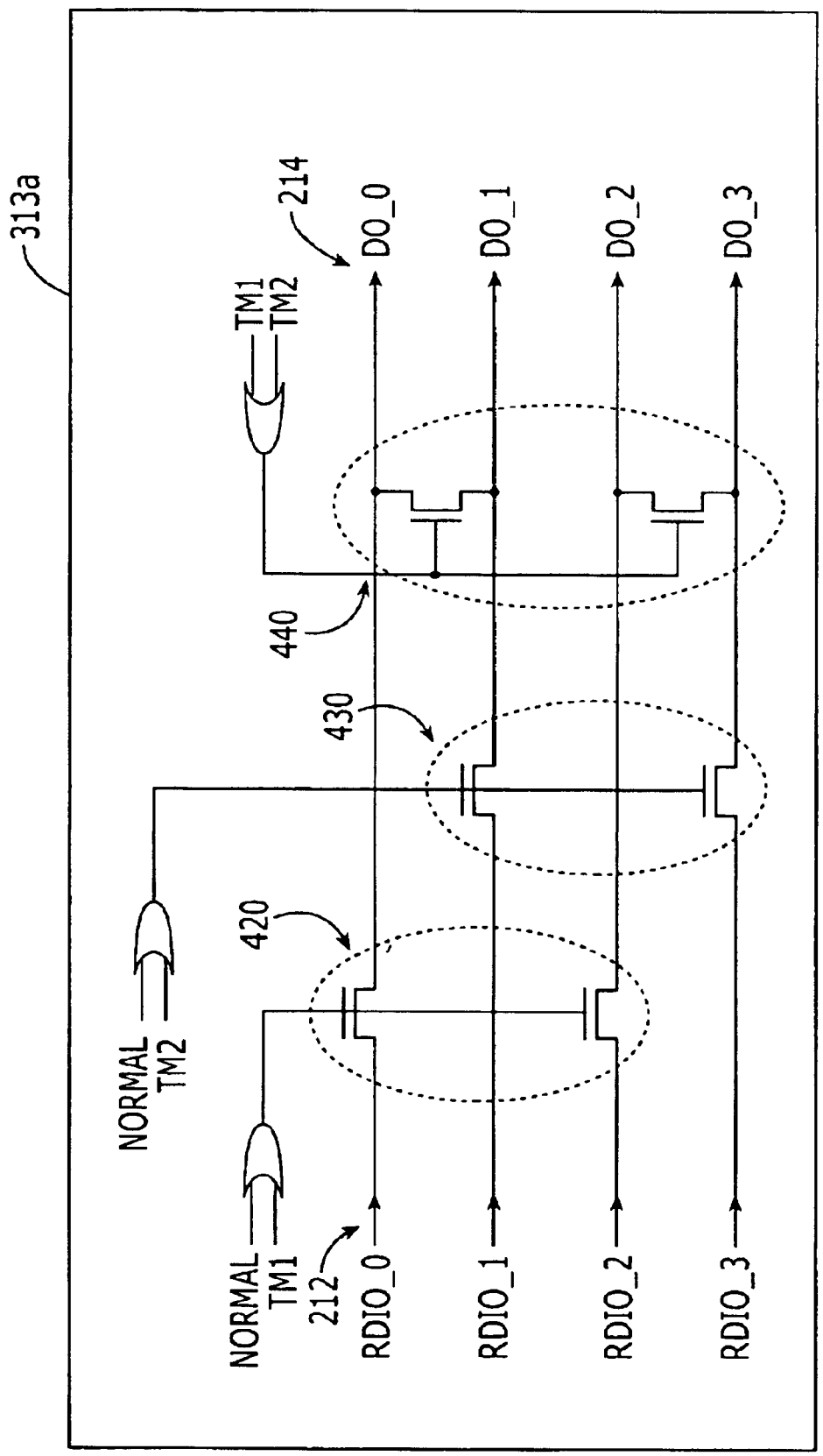
FIG. 4 is a schematic diagram of multiplexers that may be used in embodiments of FIG. 3 according to other embodiments of the present invention.

FIG. 4 is a schematic diagram of a multiplexer 313 that can be provided according to some embodiments of the present invention, such at the multiplexer 313a of FIG. 3. As shown in FIG. 4, the multiplexer 313a comprises a first switch 420 that is configured to couple a respective even first data line RDIO_0, RDIO_2 to a respective even second data line DO_0, DO_2 in the first submode (TM1). A second switch 430 is configured to couple a respective odd first data line RDIO_1, RDIO_3 to a respective odd second data line DO_1, DO_3 in the second submode (TM2). An equalizing circuit 440 is configured to couple a respective odd second data line DO_1, DO_3 to a respective adjacent even second data line DO_0, DO_2 in the first and second submodes. Accordingly, as shown in FIG. 4, first read data RDIO_0, RDIO_2 that is generated from the memory cell array 211 on the first data lines 212 are respectively transferred to second read data DO_0, DO_2 on the second data lines 214 in response to the first test mode signal (TM1). At the same time, the equalizing circuit 440 is activated so that each pair of even/odd second read data (DO_0/1, DO_2/3) are maintained at the same level while the second switch 430, which receives a second test mode signal, (TM2) is deactivated. The odd read data RDIO_1, RDIO_3 can be processed similarly, so that the valid data window of the output data DOUT may be enlarged to twice that of the normal mode. In the normal mode, the equalizing circuit 440 is deactivated.

Figure 5:
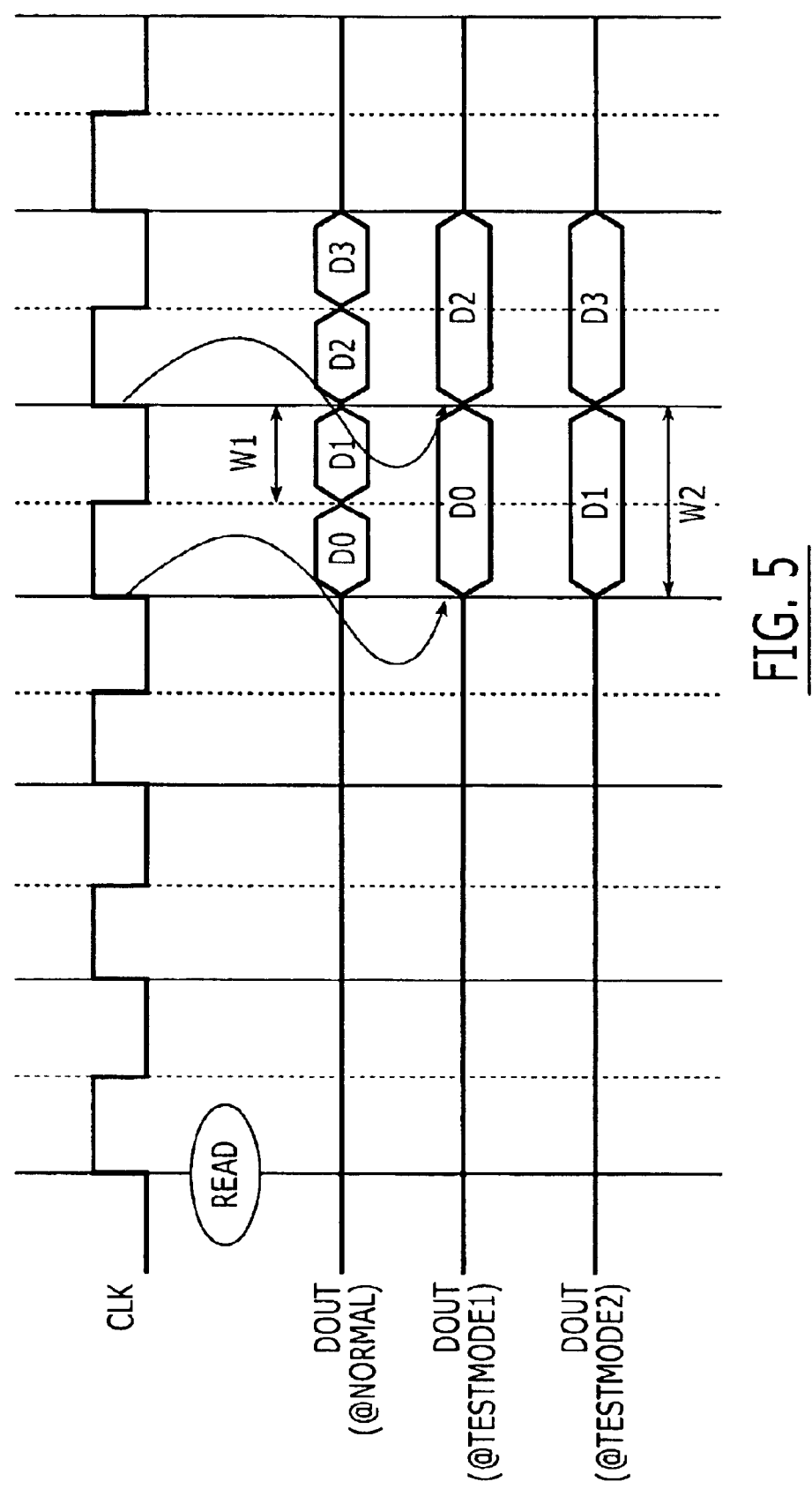
FIGS. 5 and 6 are timing diagrams of operations that may be performed in embodiments of FIGS. 3 and 4, according to various embodiments of the present invention.

FIG. 5 is a timing diagram of normal and test modes of operations for reading data from a memory device according to some embodiments of the present invention, such as were described in connection with FIGS. 3 and 4. As shown in FIG. 5, in the normal mode, read data D0–D3 is transferred to the external terminal DOUT in response to the rising and falling edges of a clock signal (CLK) with a valid data window of W1. Moreover, as also shown in FIG. 5, the even and odd data (DO_0/2, DO_1/3), respectively, is transferred to the external terminal DOUT with an enlarged data window W2 in the test mode in response to the rising edge of an external clock signal.

Figure 6:
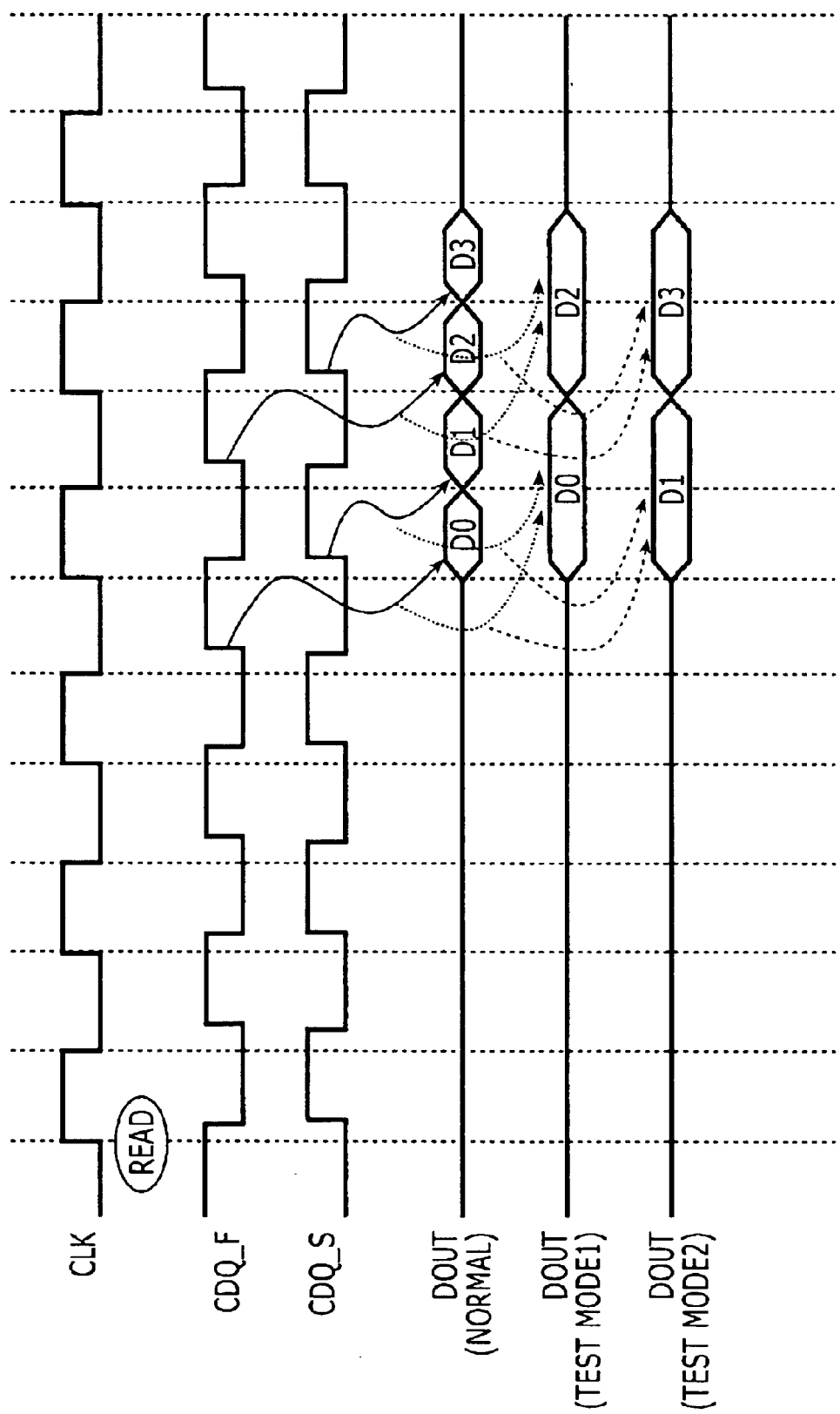

FIG. 6 is a more detailed timing diagram illustrating operations that may be performed by output circuits according to embodiments of the invention such as were described in connection with FIGS. 3–5. As shown in FIG. 6, a first internal clock signal CDQ_F is generated in response to the rising edge of the clock signal CLK. A second internal clock signal CDQ_S is generated in response to the falling edge of the clock signal CLK. In the normal mode, the output data D0–D3 is transferred to the external terminal DOUT in response to the CDQ_F and CDQ_S signals, corresponding to the rising and falling edges of the clock signal CLK. In Test Mode 1, the output data D0 and D2 is transferred to the external terminal DOUT with an enlarged data window since the even and odd data is maintained at the same level. Similar operations are provided for output data D1 and D3 in Test Mode 2.

It will also be understood by those having a skill in the art that the output of DOUT in Test Mode 1 and in Test Mode 2 generally will occur in offset clock cycles from one another, rather than in the same or overlapping clock cycles as shown in FIGS. 5 and 6. Overlapping clock cycles are shown in FIGS. 5 and 6 so that a comparison may be made between the normal and test modes and so as not to further enlarge the width of the timing diagrams.

FIGS. 7–10 illustrate integrated circuit memory devices and operating methods according to other embodiments of the present invention. In general, in these embodiments, the memory cell array is responsive to a clock signal having rising and falling edges. The output circuit is responsive to a first internal clock signal that is generated in response to the rising edge of the clock signal and to a second internal clock signal that is generated in response to the falling edge of the clock signal in the normal mode of operation. In the test mode of operation, however, the output circuit is responsive to only one of the first internal clock signal or the second internal clock signal. Data bits may thereby be output at a second data rate that is lower than the first data rate in the test mode of operation.

Figure 7:
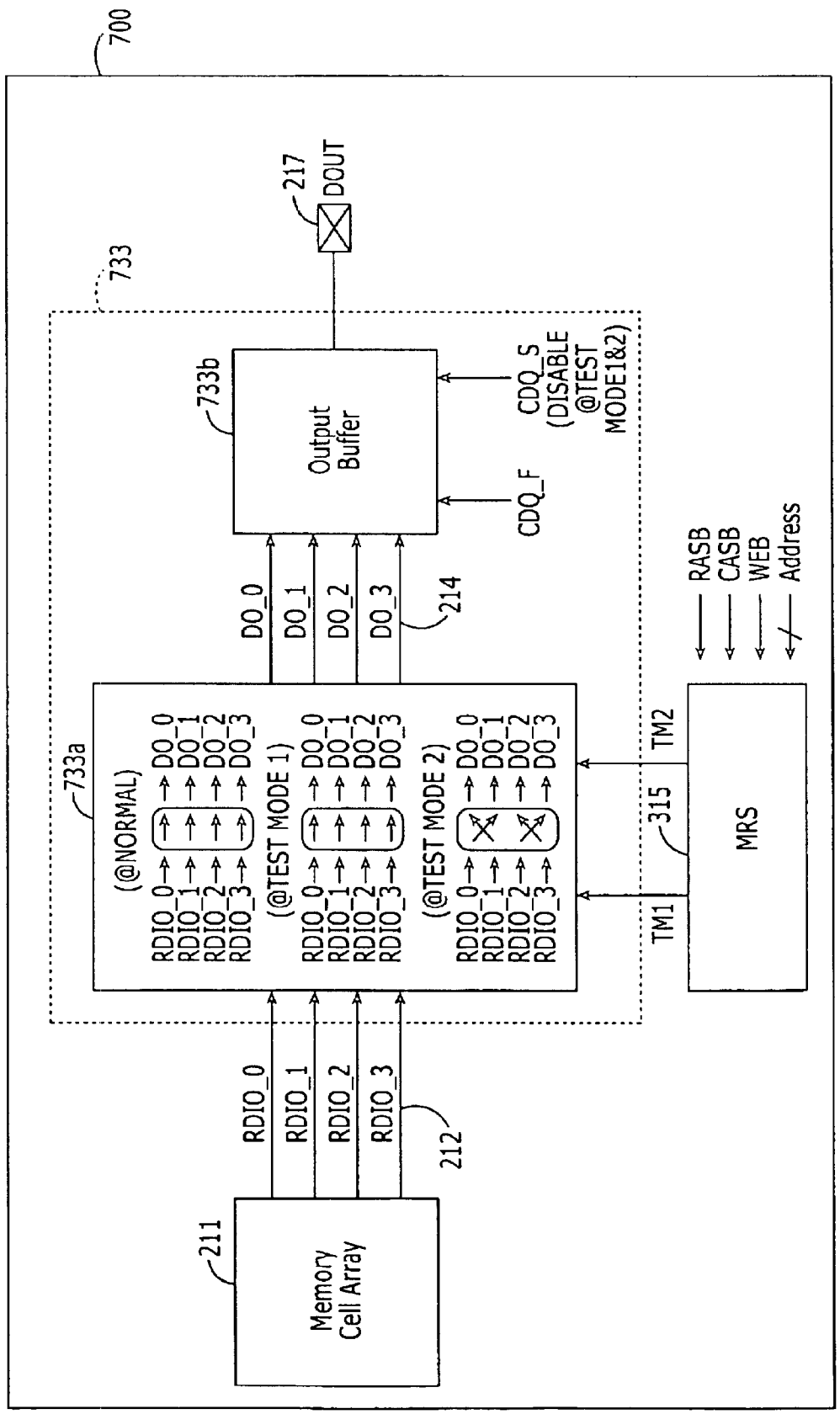
FIG. 7 is a block diagram of integrated circuit memory devices and operating methods according to other embodiments of the invention.

More specifically, referring to FIG. 7, in these embodiments, the output circuit 733 includes a multiplexer 733a that is configured to couple a respective first data line 212 to a respective second data line 214 in the normal mode of operation, as shown for example at the top third of the multiplexer 733a. In a first submode of the test mode of operation, also referred to as Test Mode 1 in FIG. 7, a respective first data line 212 is coupled to a respective second data line as shown in the middle third of the multiplexer 733a. Finally, in a second submode of the test mode of operation, also referred to as Test Mode 2 in FIG. 7, respective odd and even first data lines 212 are cross-coupled to respective even and odd second data lines 214, as shown at the bottom third of the multiplexer 733a.

Still continuing with the description of FIG. 7, an output buffer 733b is also provided in the output circuit 733. The output buffer 733b is responsive to a first internal clock signal CDQ_F that is generated in response to the rising edge of the clock signal and to a second internal clock signal CDQ_S that is generated in response to the falling edge of the clock signal in the normal mode of operation. In the test mode of operation, and in particular in the first and second submodes of the test mode of operations, the output buffer 733b is responsive to only one of the first internal clock signal or the second internal clock signal. In some embodiments, as shown in FIG. 7, the output buffer is only responsive to the first internal clock signal CDQ_F in the test mode of operation, and the second internal clock signal CDQ_S is disabled in the first and second submodes of the test mode of operation.

Accordingly, FIG. 7 illustrates how a valid data window of output data DOUT of an output buffer 733b may be enlarged by a predetermined value, for example, doubled compared to the valid data window of read data RDIO_0–RDIO_3 that is output from the memory cell array 211, by disabling the second clock signal CDQ_S in the test mode. Thus, the output buffer 733b is not operated by the second internal clock signal CDQ_S so that the read data DO_0–DO_3 may be output to the external terminal 217 with an enlarged valid data window.

Figure 8:
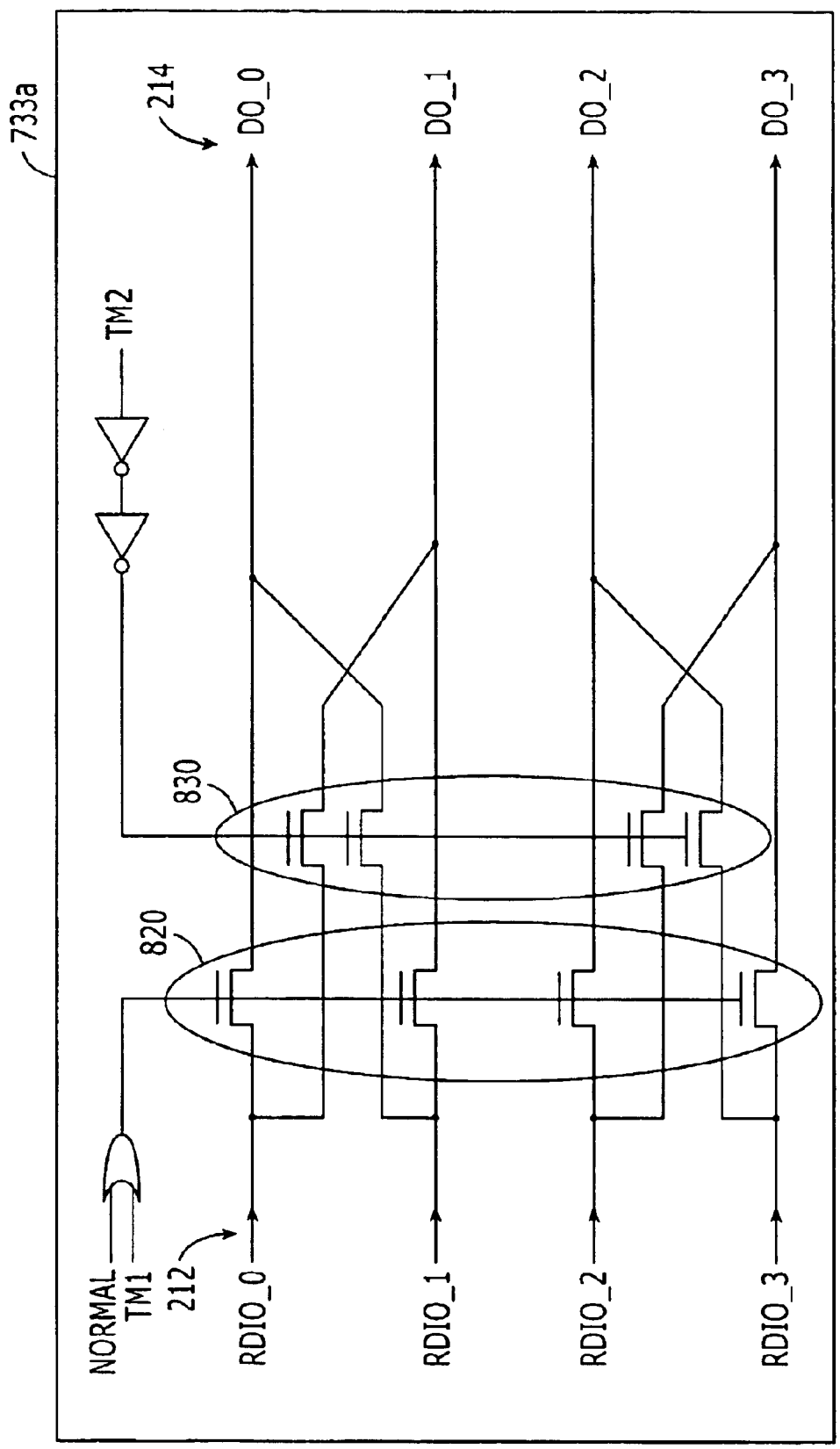
FIG. 8 is a schematic diagram of a multiplexer that may be used in embodiments of FIG. 7 according to other embodiments of the present invention.

FIG. 8 is a schematic diagram of embodiments of a multiplexer such as a multiplexer 733a of FIG. 7, according to these embodiments of the present invention. As shown in FIG. 8, the multiplexer comprises a first switch 820 that is configured to couple a respective first data line RDIO_0–RDIO_3 to a respective second data line DO_0–DO_3 in the normal mode and in the first submode (TM1). A second switch 830 is configured to cross-couple respective odd and even first data lines to respective even and odd second data lines in the second submode (TM2). Accordingly, the first read data (RDIO_0–RDIO_3) that is generated from the memory cell array on the first data lines 212 is respectively transferred to the second data lines 214 (DO_0–DO3_3) in response to the first test mode signal (TM1). Also, each of the first read data (RDIO_0–RDIO_3) generated from the memory cell 211 on the first data lines 212 is respectively transferred to adjacent second data lines 214 (DO_1/DO_0, DO_3/DO_2) in response to the second test mode signal (TM2).

Figure 9:
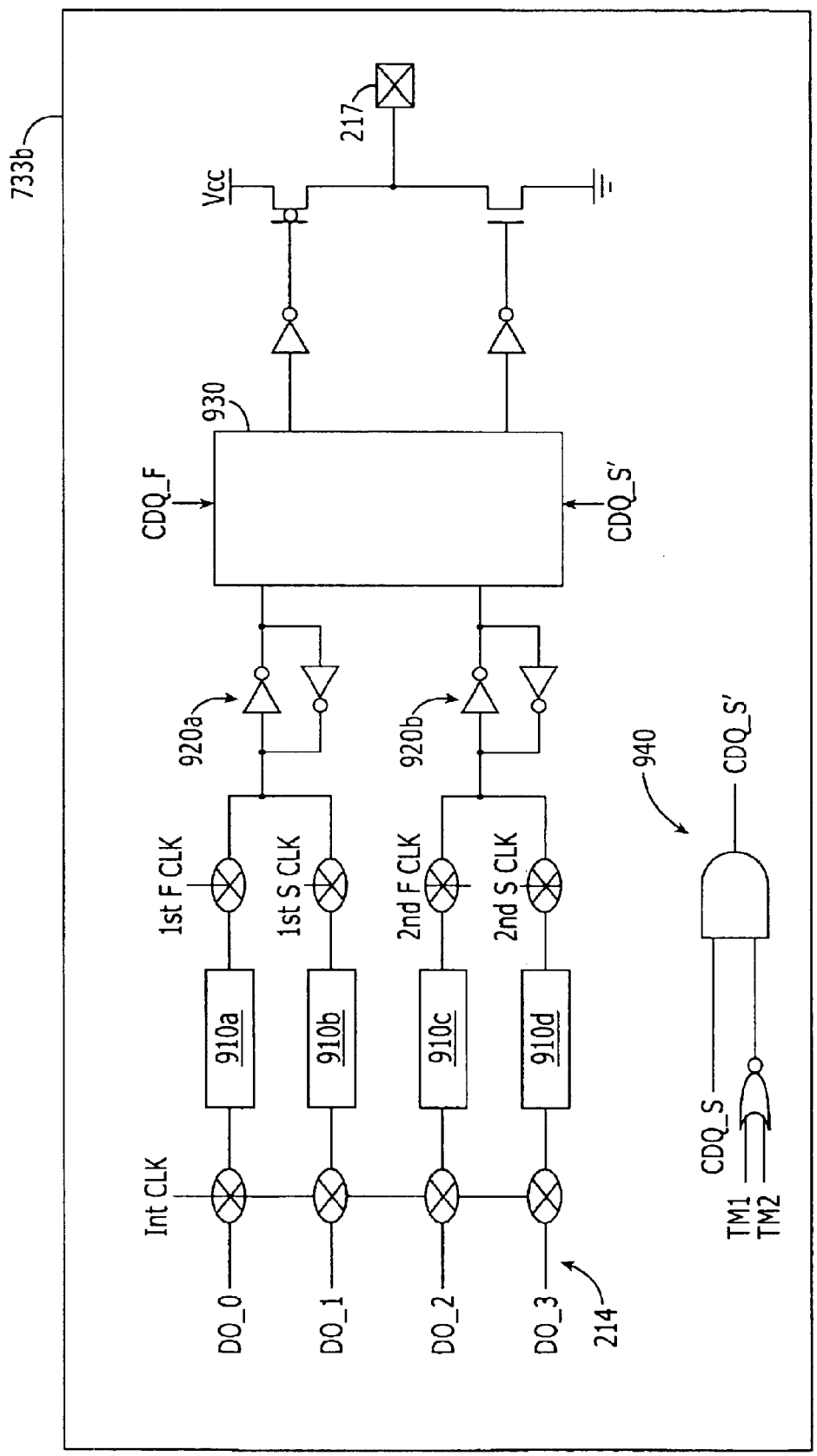
FIG. 9 is a schematic diagram of an output buffer that may be used in embodiments of FIG. 7 according to other embodiments of the present invention.

FIG. 9 is a schematic diagram of an output buffer, such as the output buffer 733b of FIG. 7, according to these embodiments of the present invention. More specifically, as shown in FIG. 9, the output buffer 733b comprises a corresponding plurality of registers 910a–910d, a respective one of which is configured to store read data from a respective first data line 212. A latch 920a, 920b is associated with a respective pair of adjacent registers 910a/910b, 910c/910d. A respective latch 920a–920b is configured to latch data from a first adjacent register in response to the first internal clock signal ($1^{st}$ F CLK, $2^{nd}$ F CLK) and to latch data from a second adjacent register in response to the second internal clock signal ($1^{st}$ S CLK, $2^{nd}$ S CLK). A parallel-to-serial converter, comprising a multiplexer 930, is responsive to the latches 920a, 920b, and to the first and second internal clock signals in the normal mode of operation. The multiplexer 930 is responsive to only one of the first and second internal clock signals during both the first and second submodes of operation.

In more detail, the second read data DO_0–DO_3 on the second read data lines 214 are transferred to the register 910a–910d in parallel in response to the internal clock signal INTCLK. The data DO_0 and DO_1 stored in the top two registers 910a, 910b of FIG. 9 is sequentially transferred to the first latch 920a in response to occurrences of the first rising and first falling clock ($1^{st}$ F CLK and $1^{st}$ S CLK) while each of the data DO_2 and DO_3 stored in the bottom two registers 910c, 910d is also sequentially transferred to the second latch 920b in response to occurrences of the second rising and second falling clock ($2^{nd}$ F CLK and $2^{nd}$ S CLK) in the normal mode of operation. Thus, each of the data DO_0–DO_3 is output to the external terminal 217 in response to the first and second internal clock signal (CDQ_F, CDQ_S) which is sequentially activated in the normal mode of operation. However, in the test mode of operation, even though the data DO_0 and DO_1 stored in the top two registers 910a, 910b of FIG. 9 is sequentially transferred to the first latch 920a in response to occurrences of the first rising and first falling clock ($1^{st}$ F CLK and $1^{st}$ S CLK), only the data DO_0 is transferred to the external terminal 217 with the second data rate that is lower than the first data rate, because only first internal clock CDQ_F is activated. Moreover, although each of the data DO_2 and DO_3 stored in the bottom two registers 910c, 910d is also sequentially transferred to the second latch 920b in response to occurrences of the second rising and second falling clock ($2^{nd}$ F CLK and $2^{nd}$ S CLK), only the data DO_2 is transferred to the external terminal 217 with the second data rate that is lower than the first data rate of normal mode. That is, the data DO_0 is output until the next rising clock (CDQ_F) for data DO_2 is input. Thus, the valid data window is enlarged. Each of the first read data RDIO_1, 3 is also transferred to second read data DO_0, 2 in the second test mode (TM2). Then the data DO_0, 2 is transferred to the external terminal 217 with an enlarged data window. Thus, all of the data RDIO_0–RDIO_3 can be externally output in the two test modes (TM1, TM2). FIG. 9 also illustrates a logic circuit 940 that may be used to disable the falling clock CDQ_S during the first and second test modes.

Figure 10:
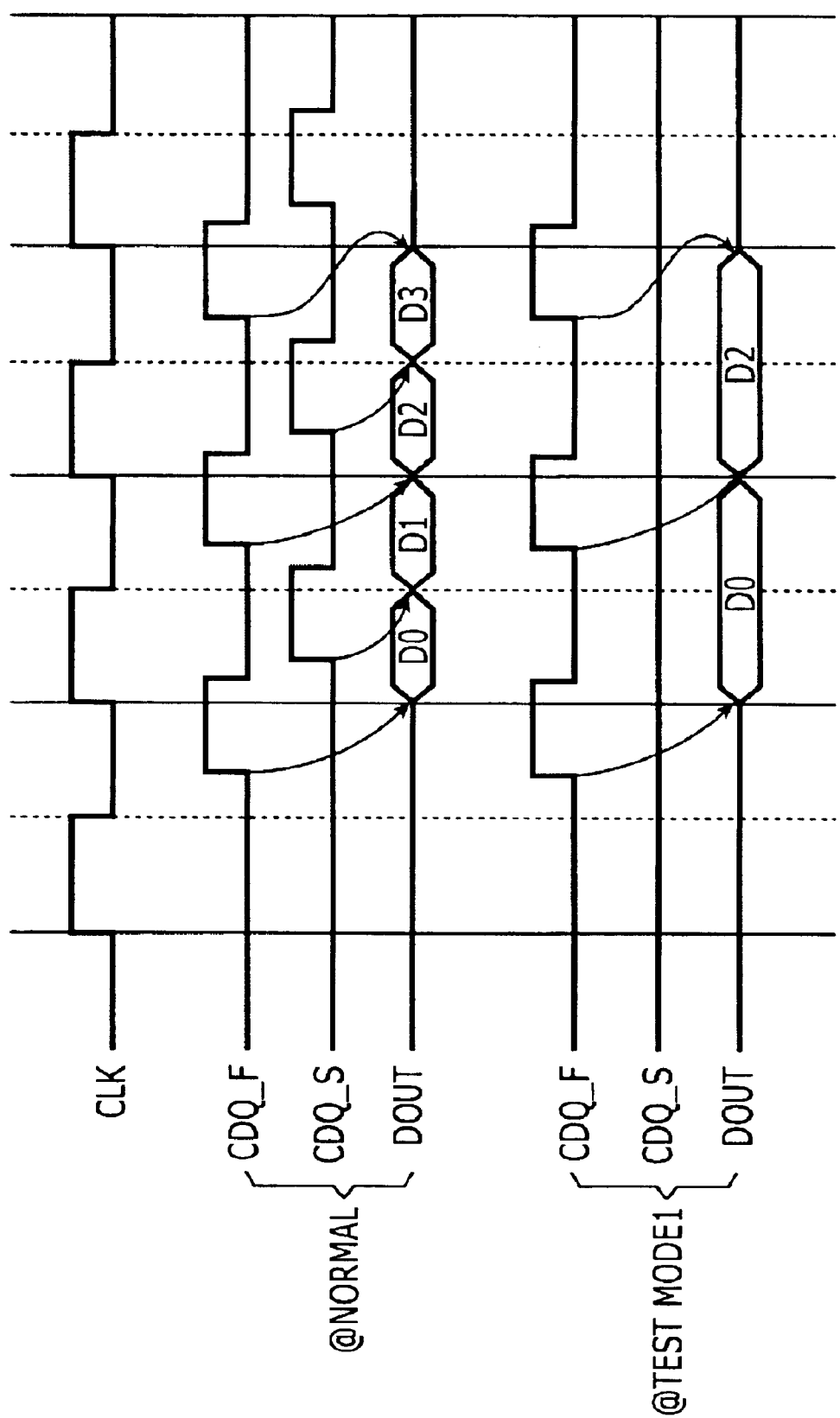
FIG. 10 is a timing diagram of operations that may be performed by embodiments of FIGS. 7–9 according to other embodiments of the present invention.

FIG. 10 is a timing diagram illustrating generation of output data during normal operations and during the test mode operation, for example using embodiments of FIGS. 7–9. As shown in the top half of FIG. 10, during a normal mode of operation, the output circuit 733 is responsive to a first internal clock signal CDQ_F that is generated in response to the rising edge of the clock signal CLK and to a second internal clock signal CDQ_S' that is generated in response to the falling edge of the clock signal CLK, to serially output the plurality of data bits D0–D3 to an external terminal at the first data rate. During test mode, as shown in the bottom portion of FIG. 10, the output circuit 733 is responsive to only one of the first internal clock signal or the second internal clock signal, here shown as the first internal clock signal CDQ_F. As shown in the bottom half of FIG. 10, during Test Mode 1 data on even ones of the second data lines DO_0 and DO_2 is output at the second data rate that is lower than the first data rate. Although not shown in FIG. 10, similar operations may be performed in Test Mode 2 except that the data on the odd second data lines DO_1 and DO_3 are transferred to the even test lines. Accordingly, operations during Test Mode 2 may be the same as shown in Test Mode 1, except that data D1 and D3 are output.

Figure 11:
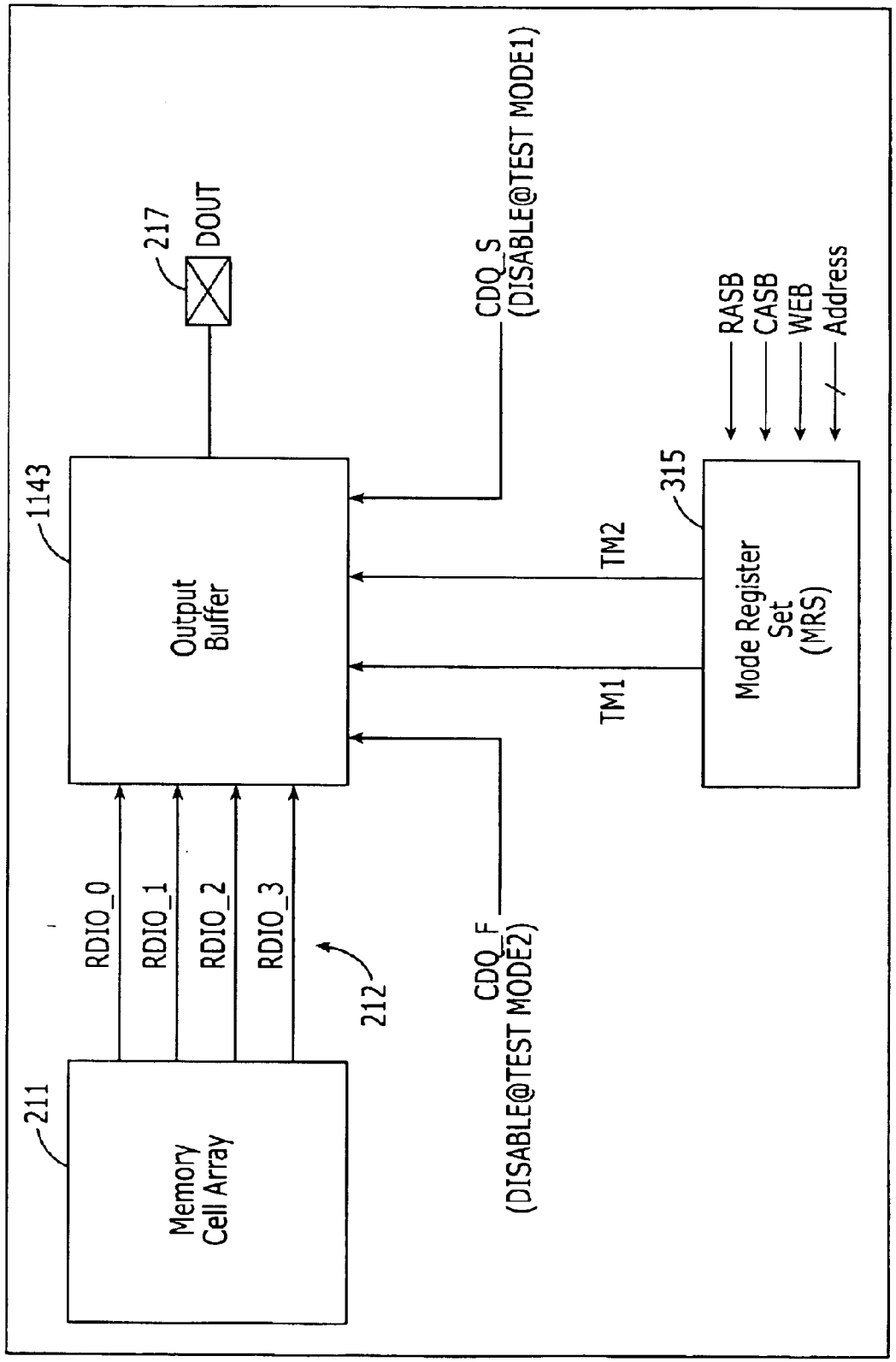
FIG. 11 is a block diagram of integrated circuit memory devices and operating methods according to yet other embodiments of the present invention.
Figure 12:
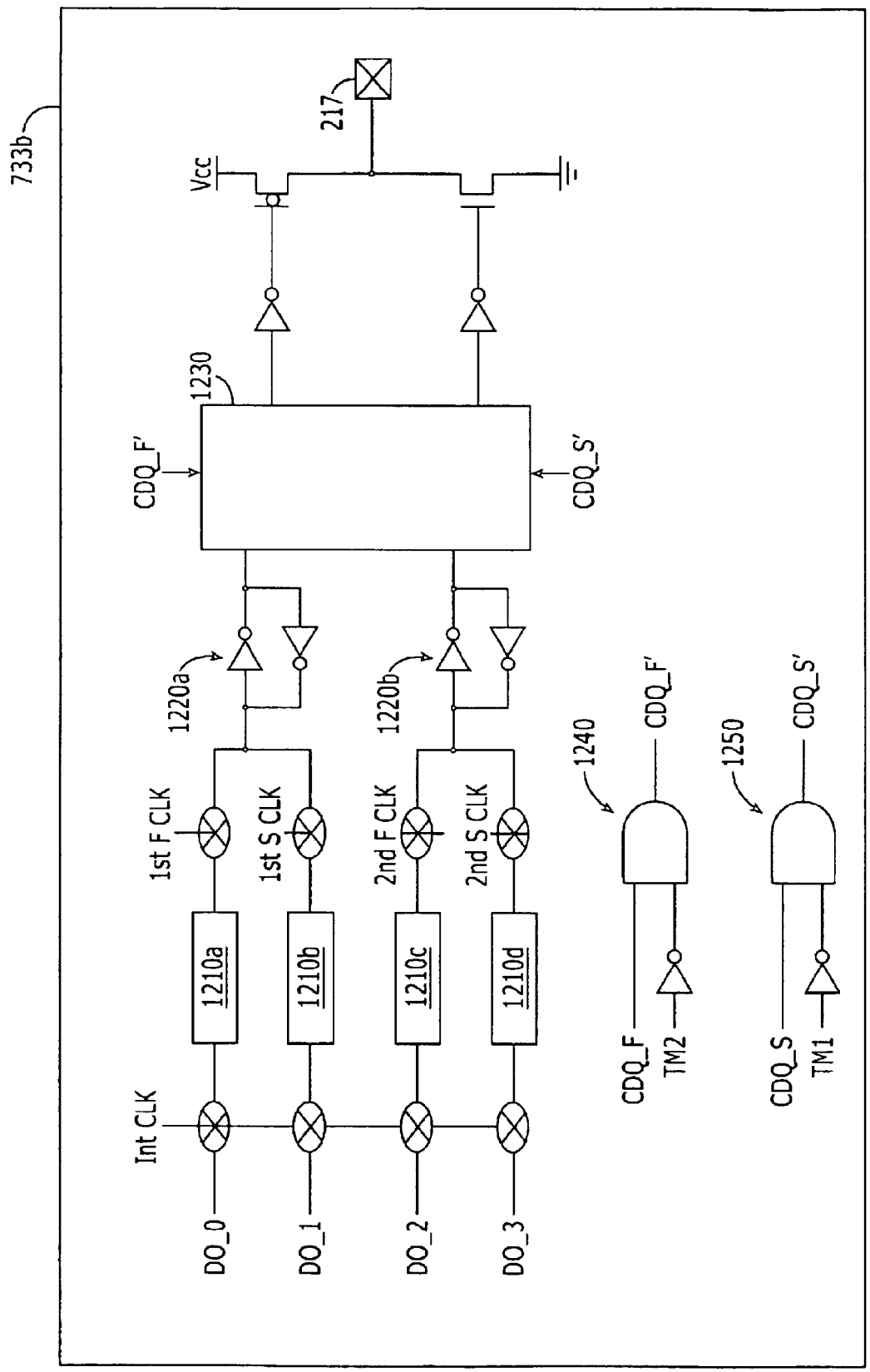
FIG. 12 is a schematic diagram of an output buffer that may be used in embodiments of FIG. 11 according to other embodiments of the present invention.
Figure 13:
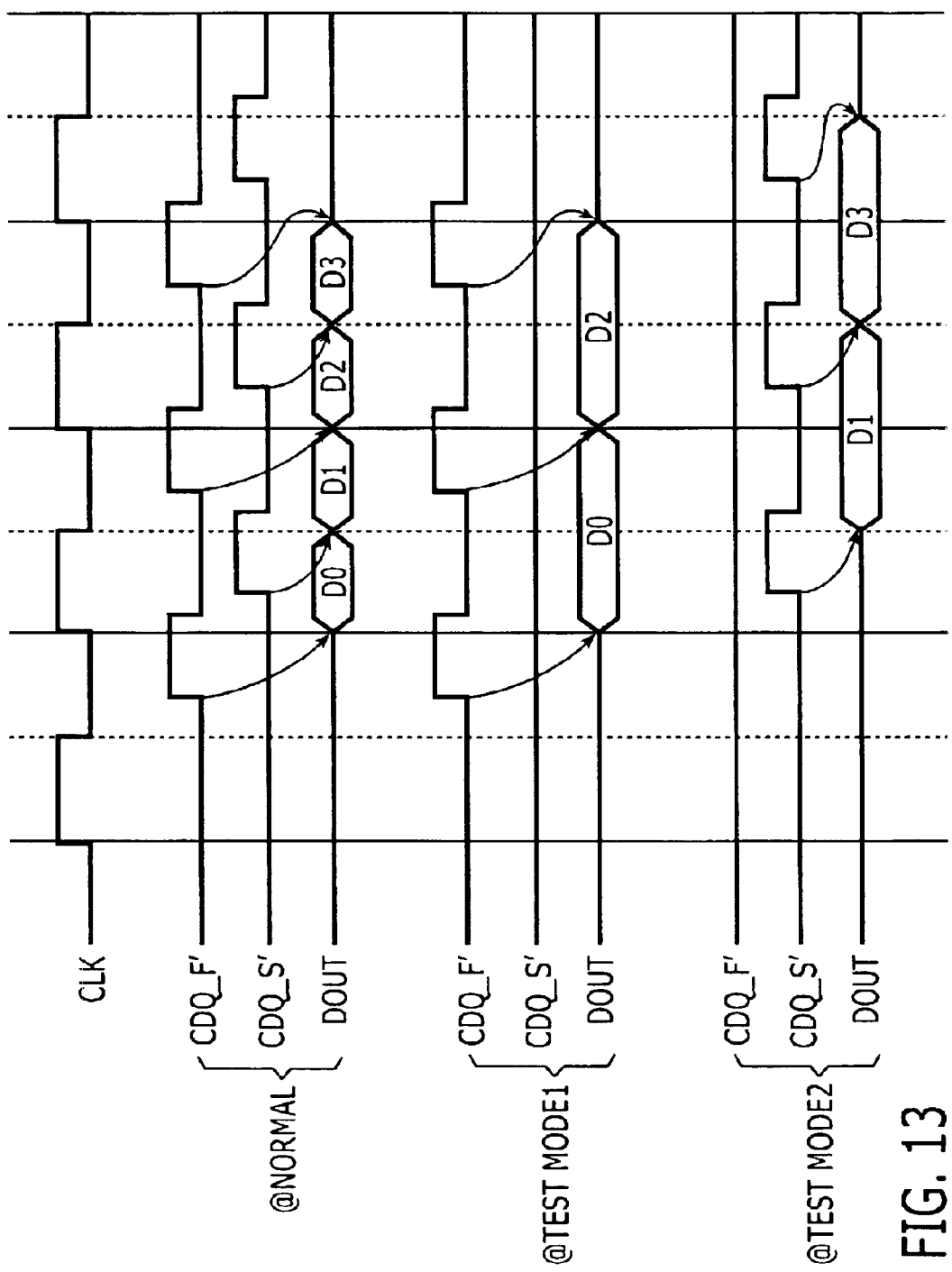
FIG. 13 is a timing diagram that may be used in embodiments of FIGS. 11 and 12 according to other embodiments of the present invention.

FIGS. 11–13 illustrate integrated circuit memory devices and operating methods according to yet other embodiments of the present invention. As will be described below, in these embodiments, the output circuit is responsive to a first internal clock signal that is generated in response to the rising edge of the clock signal and to a second internal clock signal that is generated in response to the falling edge of the clock signal in the normal mode of operation. The output circuit is alternatingly responsive to the first internal clock signal and to the second internal clock signal in the test mode of operation. More specifically, referring to FIG. 11, the memory cell array 211 is configured to output the plurality of data bits in parallel at the first data rate over a corresponding plurality of first data lines 212. The output circuit comprises an output buffer 1143 that is configured to serially output data to the external terminal.

Even more specifically, still referring to FIG. 11, the memory cell array 211 is responsive to a clock signal having rising and falling edges. The output buffer 1143 is responsive to a first internal clock signal CDQ_F that is generated in response to the rising edge of the clock signal and to a second internal clock signal CDQ_S that is generated in response to the falling edge of the clock signal in the normal mode of operation. In the first submode of the test mode (TM1), the output buffer 1143 is responsive to only one of the first internal clock signal or the second internal clock signal, shown as only the first internal clock signal CDQ_F. In the second submode of the test mode of operation, shown as Test Mode 2 in FIG. 1, the output buffer 1143 is responsive to only the other of the first internal clock signal or the second internal clock signal, shown in FIG. 11 as being responsive to only the second internal clock signal CDQ_S.

Thus, in FIG. 1, the valid data window of output data DOUT of an output buffer 1143 may be enlarged by alternatingly disabling each of the CDQ_F and CDQ_S signals in the test mode. In some embodiments, the first internal clock signal CDQ_F is disabled in the second test mode whereas the second internal clock signal CDQ_S is disabled in the first test mode. Thus, the read data may be output with an enlarged window.

FIG. 12 is a block diagram of an output buffer, such as the output buffer 1143 of FIG. 1, according to some embodiments of the present invention. As shown in FIG. 12, the output buffer 1143 comprises a corresponding plurality of registers 1210a–1210d, a respective one is configured to store read data from a respective first data line. A latch 1220a, 1220b is associated with a respective pair of adjacent registers 1210a/1210b, 1210c/1210d. A latch 1220a is configured to latch data from a first adjacent register 1210a, 1210b in response to the first rising and first falling clock signal ($1^{st}$ F CLK, $1^{st}$ S CLK) and a latch 1220b is also configured to latch data from a second adjacent register 1210c, 1210d in response to the second rising and second falling clock signal ($2^{nd}$ F CLK, $2^{nd}$ S CLK). A parallel-to-serial converter 1230 is responsive to the latches 1220a, 1220b and to the first and second internal clock signals CDQ_F, CDQ_S in the normal mode of operation, is responsive to only one of the first and second internal clock signals, such as CDQ_F, during the first test submode of operation and is responsive to only the other of the first and second internal clock signals, such as CDQ_S, during the second test submode of operation. FIG. 12 also illustrates logic circuits 1240 and 1250 that may be configured to disable the first clock signal CDQ_F in the second test mode and to disable the second clock signal CDQ_S in the first test mode, respectively.

FIG. 13 is a timing diagram of operations that may be performed according to these embodiments of the present invention, for example, by the output circuits of FIGS. 11 and 12. As shown in the top third of FIG. 13, in the normal mode, the output circuit is responsive to both the first and second internal clock signals CDQ_F', CDQ_S'. The first internal clock signal CDQ_F (or CDQ_F') is responsive to the rising edge of the clock signal CLK and the second internal clock signal CDQ_S (or CDQ_S') is responsive to the falling edge of the clock signal CLK. In the first test mode, as shown in the middle of third of FIG. 13, the second internal clock signal, CDQ_S' is disabled and the output circuit is only responsive to the first internal clock signal, CDQ_F'. In the second test mode, as shown at the bottom third of FIG. 13, the output circuit is only responsive to the second internal clock signal (DQ_S'). Thus, as was described in FIG. 12, the data DO_0 and DO_2 stored in the register circuits 1210a, 1210c are transferred to the latch circuits 1220a and 1220b in response to the first and second rising clock signals (1$^{st}$ F CLK, 2$^{nd}$ F CLK). After that, the data DO_0 is output until the next rising of the first internal clock signal (CDQ_F'), at which time the next DO_2 is output so that the valid data window is enlarged. In Test Mode 2, the odd data DO_1 and DO_3 stored in the register circuits 1210b, 1210d are transferred to the latch circuits 1220a and 1220b in response to the first and second falling clock signals (1$^{st}$ S CLK, 2$^{nd}$ S CLK). Then the data DO_1 is output until the next rising of the second internal clock signal (CDQ_S'), at which time the data DO_3 is output. Thus, the valid data window for the odd data also is enlarged.

Figure 14:
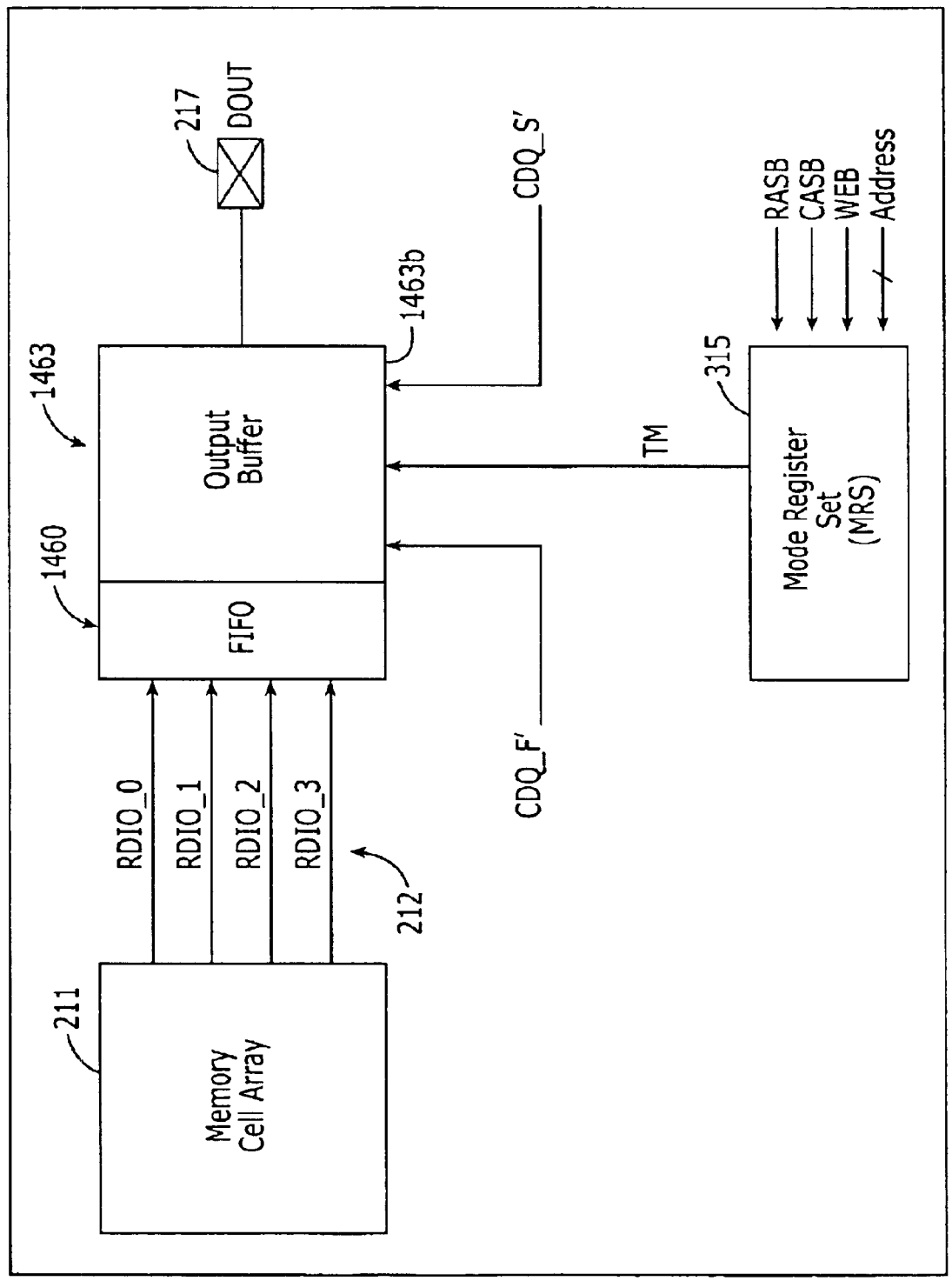
FIG. 14 is a block diagram of integrated circuit devices and operating methods according to still other embodiments of the present invention.
Figure 16:
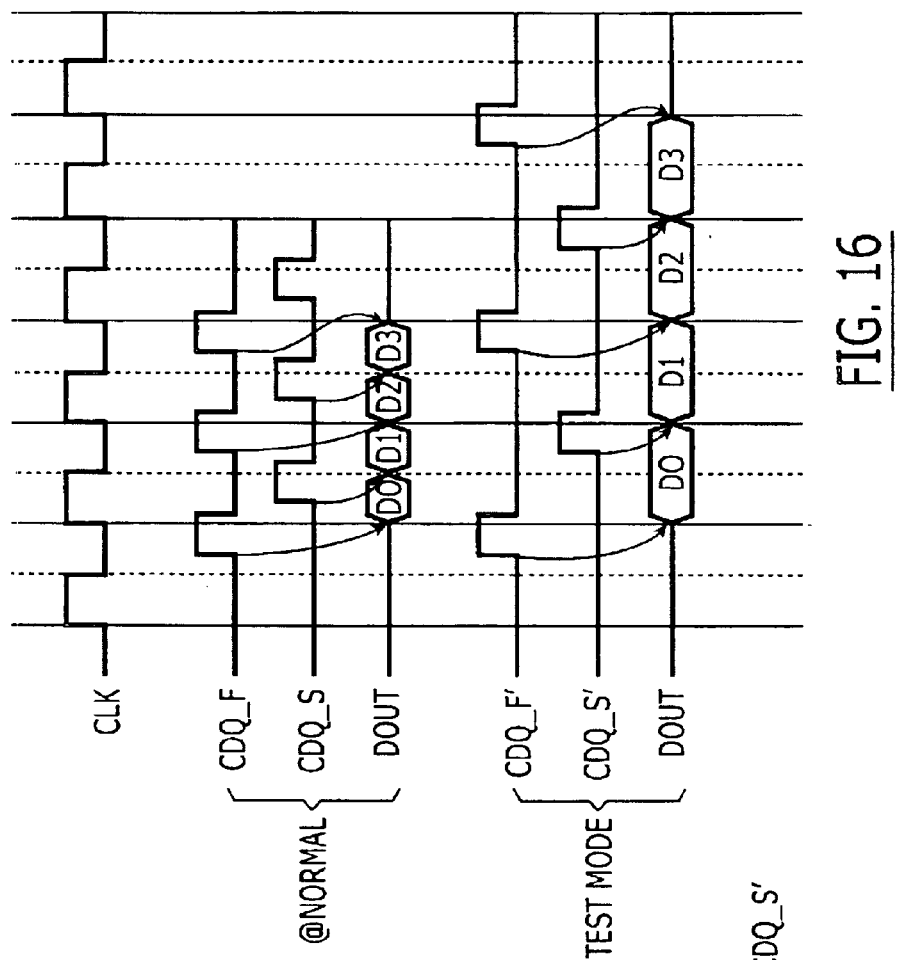
FIG. 16 is a timing diagram of operations that may be performed by embodiments of FIGS. 14, 15A and 15B according to still other embodiments of the present invention.

FIGS. 14–16 illustrate yet other integrated circuit devices and operating methods according to yet other embodiments of the present invention. In general, these embodiments, the output circuit is responsive to a first internal clock signal that is generated in response to the rising edge of the clock signal and to a second internal clock signal that is generated in response to the falling edge of the clock signal in the normal mode of operation. In a test mode of operation, the output circuit is responsive to a divided first internal clock signal that is generated from the first internal clock signal, and to a divided second internal clock signal that is generated from the second internal clock signal. In some embodiments, the divided first internal clock signal and the divided second internal clock signal are of half the frequency of the first internal clock signal and the second internal clock signal.

More specifically, as shown in FIG. 14, in some embodiments of the present invention, a First In First Out (FIFO) register 1460 may be used to store the data from the first data lines 212. An output buffer 1463 is responsive to the first and second internal clock signals during the normal mode. However, in a test mode TM the output buffer is responsive to divided first and second internal clock signals. Thus, the frequency of the clock may be divided, for example, in half, in the test mode.

Thus, a valid test window of output data DOUT of an output buffer 1463 may be enlarged by dividing the frequency of each of the CDQ_F and CDQ_S signals in the test mode. That is, the frequency of each of the internal clock signals CDQ_F and CDQ_S may be divided to a lower frequency in response to the test mode signal TM. The test mode signal may be generated from a mode register set (MRS) receiving a plurality of command signals (RASB, CASB, WEB) and address signals. Therefore, during test mode, the data window of the output data may be enlarged.

Figure 15A:
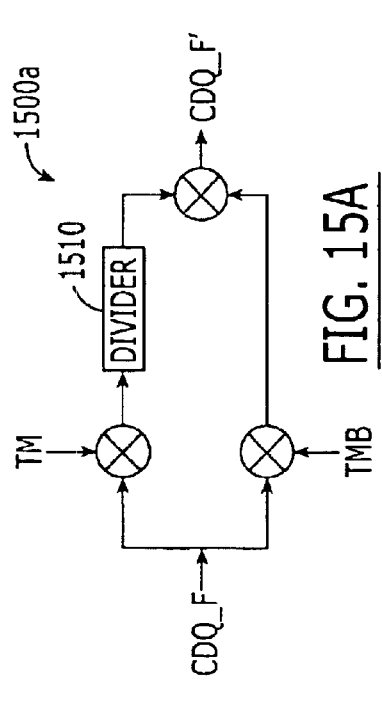
FIGS. 15A and 15B are block diagrams of divider circuits that may be used in embodiments of FIG. 14 according to other embodiments of the present invention.
Figure 15B:
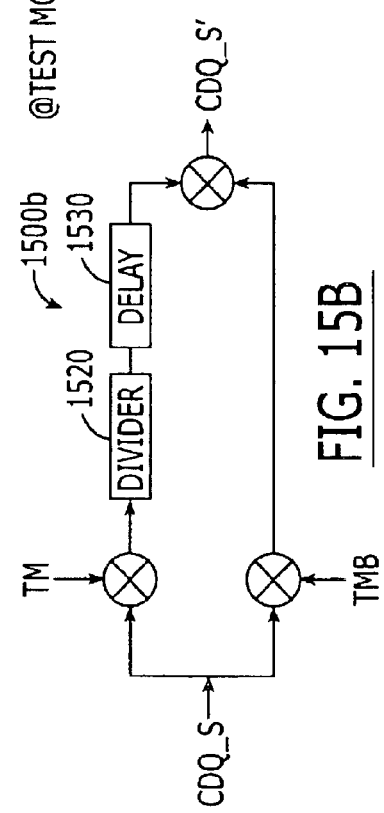

FIGS. 15A and 15B are block diagrams of divider circuits that may be used to generate the divided internal clocks from the internal clocks during test mode, according to these embodiments of the present invention. In particular, as shown in FIG. 15A, a first dividing circuit 1500a is configured to generate the divided first internal clock signal CDQ_F' in response to the first internal clock signal CDQ_F and a test mode select signal TM. As shown in FIG. 15B, a second dividing circuit 1500b is configured to generate the divided second internal clock signal CDQ_S' in response to the second internal clock signal CDQ_S and the test mode select signal TM.

More specifically, as shown in FIG. 15A, in some embodiments, the first dividing circuit 1500a includes a first divider 1510 that is responsive to the rising edge of the clock signal and to the test mode signal. Also, in some embodiments, the second dividing circuit 1500b comprises a second divider 1520 that is responsive to the falling edge of the clock signal and to the test mode signal, and a delay element 1530 that is responsive to the second divider 1520. The delay element 1530 may be used to increase the time interval of rising edge between the first and second divided clocks so that the output data at the external terminal 217 may be output with the enlarged valid data window, in some embodiments.

FIG. 16 is a timing diagram of operations according to embodiments of FIGS. 14, 15A and 15B. Referring to FIGS. 14, 15A, 15B and 16, the data RDIO_0–RDIO_3 is stored in the FIFO register 1460 and then transferred to an output buffer 1463 in response to the internal clock signal. Thereafter, all the data in the output buffer 1463 is externally output in response to the first and second internal clock signals (CDQ_F and CDQ_S) in the normal mode, as shown in the top half of FIG. 16. As shown in the bottom half of FIG. 16, in test mode, the output buffer 1463 externally outputs read data DO–D3 in response to the divided first and second internal clock signals CDQ_F', CDQ_S', respectively, so that the valid data window may be enlarged. Thus, the output buffer can operate at half speed, while the memory cell array operates at full speed like in the normal mode, in these embodiments.

Figure 17:
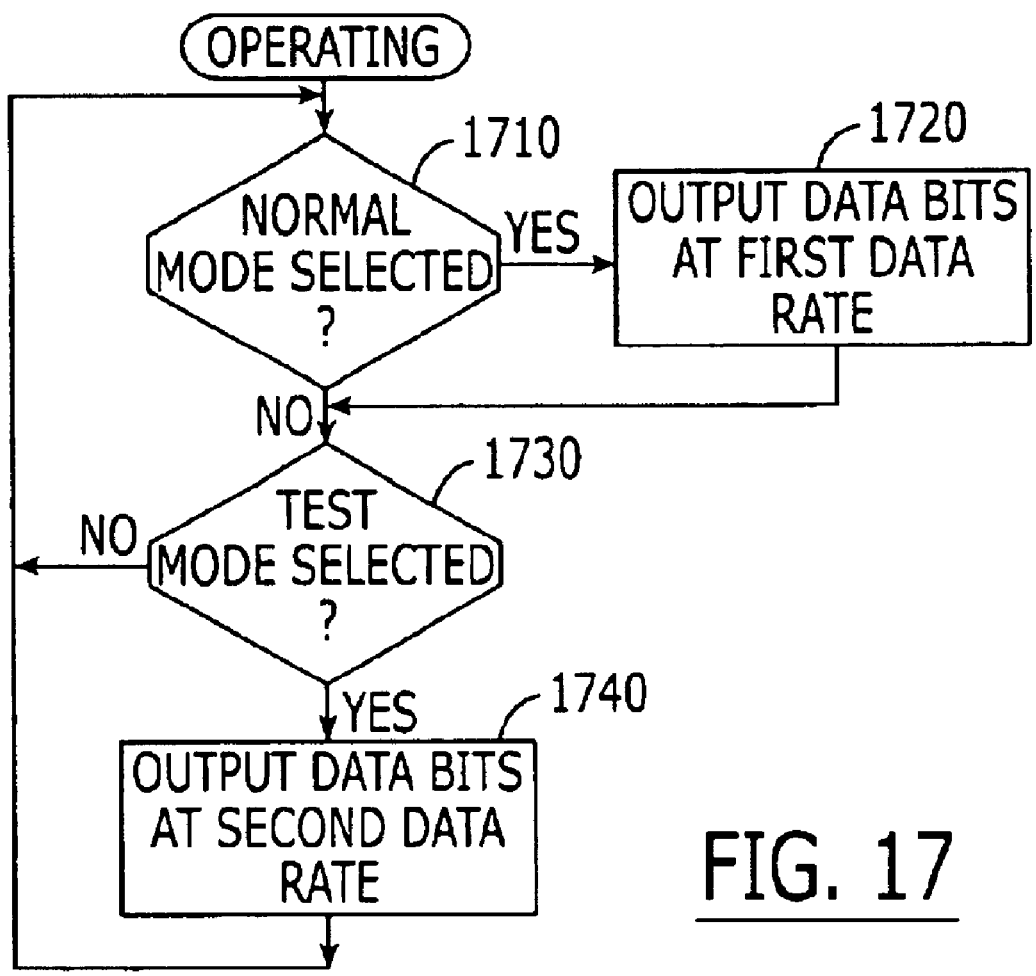
FIG. 17 is a flowchart of operations that may be performed according to various embodiments of the present invention.

FIG. 17 is a flowchart of operations that may be performed to operate an integrated circuit memory device having a memory cell array that is configured to output a plurality of data bits in parallel at a first data rate, according to various embodiments of the present invention. These operations may be performed using any of the embodiments of FIGS. 2–16 that were described above. As shown in FIG. 17, when a normal mode is selected at Block 1710, then at Block 1720 the plurality of data bits is serially output from the memory cell array to an external terminal at the first data rate. At Block 1730, when a test mode is selected, then at Block 1740 the plurality of data bits is output from the memory cell array to the external terminal at a second data rate that is lower than the first data rate. These operations may be performed using embodiments of FIGS. 2, 3–6, 7–10, 11–13 and/or 14–16, according to any of the embodiments of the invention that were described above.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An integrated circuit device comprising:
a memory cell array that is configured to output a plurality of data bits in parallel at a first data rate; and
an output circuit that is configured to serially output the plurality of data bits to an external terminal at the first data rate in a normal mode of operation, and to serially output the plurality of data bits to the external terminal at a second data rate that is lower than the first data rate, in a test mode of operation.

2. An integrated circuit device according to claim 1 wherein the memory cell array is responsive to a clock signal having rising and falling edges, wherein the first data rate is produced in response to both the rising edge and the falling edge of the clock signal and wherein the second data rate is produced in response to only one of the rising edge or the falling edge of the clock signal.

3. An integrated circuit device according to claim 1 wherein the memory cell array is configured to output the plurality of data bits in parallel at the first data rate over a corresponding plurality of first data lines and wherein the output circuit is configured to serially output the plurality of data bits to the external terminal at the first data rate in the normal mode of operation using a corresponding plurality of second data lines, and to serially output the plurality of data bits to the external terminal at the second data rate that is lower than the first data rate using the corresponding plurality of second data lines in the test mode of operation.

4. An integrated circuit device according to claim 1 wherein the output circuit is configured to replicate a first portion of the plurality of data bits that are output from the memory cell array in parallel to thereby serially output the first portion of the plurality of data bits to the external terminal at the second data rate that is lower than the first data rate, and to replicate a second portion of the plurality of data bits that are output from the memory cell array in parallel to thereby serially output the second portion of the plurality of data bits to the external terminal at the second data rate that is lower than the first data rate in the test mode of operation.

5. An integrated circuit device according to claim 1 wherein the memory cell array is responsive to a clock signal having rising and falling edges, wherein the output circuit is responsive to a first internal clock signal that is generated in response to the rising edge of the clock signal and to a second internal clock signal that is generated in response to the falling edge of the clock signal in the normal mode of operation, and is responsive to only one of the first internal clock signal or the second internal clock signal in the test mode of operation.

6. An integrated circuit device according to claim 1 wherein the memory cell array is responsive to a clock signal having rising and falling edges, wherein the output circuit is responsive to a first internal clock signal that is generated in response to the rising edge of the clock signal and to a second internal clock signal that is generated in response to the falling edge of the clock signal in the normal mode of operation, and is alternatingly responsive to the first internal clock signal and the second internal clock signal in the test mode of operation.

7. An integrated circuit device according to claim 1 wherein the memory cell array is responsive to a clock signal having rising and falling edges, wherein the output circuit is responsive to a first internal clock signal that is generated in response to the rising edge of the clock signal and to a second internal clock signal that is generated in response to the falling edge of the clock signal in the normal mode of operation, and is responsive to a divided first internal clock signal that is generated from the first internal clock signal and to a divided second internal clock signal that is generated from the second internal clock signal in the test mode of operation.

8. An integrated circuit device according to claim 1:
wherein the memory cell array is configured to output the plurality of data bits in parallel at the first data rate over a corresponding plurality of first data lines; and
wherein the output circuit comprises a multiplexer that is configured to multiplex read data on the first data lines onto a corresponding plurality of second data lines, and an output buffer that is configured to serially output data on the second data lines to the external terminal.

9. An integrated circuit device according to claim 8:
wherein the multiplexer is configured to couple a respective first data line to a respective second data line in the normal mode of operation, to couple respective even first data lines to respective even second data lines in a first submode of the test mode of operation, and to couple respective odd first data lines to respective odd second data lines in a second submode of the test mode of operation.

10. An integrated circuit device according to claim 9 further comprising:
a mode register set that is responsive to a plurality of command signals and is configured to generate first and second test mode signals to place the multiplexer in the first and second submodes, respectively, of the test mode of operation.

11. An integrated circuit device according to claim 1:
wherein the memory cell array is configured to output the plurality of data bits in parallel at the first data rate over a corresponding plurality of first data lines; and
wherein the output circuit comprises an output buffer that is configured to serially output data to the external terminal.

12. An integrated circuit device according to claim 11 wherein the memory cell array is responsive to a clock signal having rising and falling edges, wherein the output buffer is responsive to a first internal clock signal that is generated in response to the rising edge of the clock signal and to a second internal clock signal that is generated in response to the falling edge of the clock signal in the normal mode of operation, is responsive to only one of the first internal clock signal and the second internal clock signal in a first submode of the test mode of operation and is responsive to only the other of the first internal clock signal and the second internal clock signal in a second submode of the test mode of operation.

13. An integrated circuit device according to claim 12 wherein the output buffer comprises:
a corresponding plurality of registers, a respective one of which is configured to store read data from a respective first data line;
a latch that is associated with a respective pair of adjacent registers, a respective latch being configured to latch data from a first adjacent register in response to a first clock signal and to latch data from a second adjacent register in response to a second clock signal; and
a parallel-to-serial converter that is responsive to the latches and to the first and second internal clock signals in the normal mode of operation, to only one of the first and second internal clock signals during the first submode of operation and to only the other of the first and second internal clock signals during the second submode of operation.

14. An integrated circuit device according to claim 12 further comprising:
a mode register set that is responsive to a plurality of command signals and is configured to generate first and second test mode signals to place the output buffer in the first and second submodes, respectively, of the test mode of operation.

15. An integrated circuit device according to claim 11 wherein the memory cell array is responsive to a clock signal having rising and falling edges, wherein the output buffer is responsive to a first internal clock signal that is generated in response to the rising edge of the clock signal and to a second internal clock signal that is generated in response to the falling edge of the clock signal in the normal mode of operation, and is responsive to a divided first internal clock signal and a divided second internal clock signal in the test mode of operation.

16. An integrated circuit device according to claim 15 wherein the divided first internal clock signal and the divided second internal clock signal are respectively of half the frequency of the first internal clock signal and the second internal clock signal.

17. An integrated circuit device according to claim 15 further comprising:
a mode register set that is responsive to a plurality of command signals and is configured to generate a test mode signal to place the output buffer in the test mode of operation.

18. An integrated circuit device according to claim 15 further comprising:
a first dividing circuit that is configured to generate the divided first internal clock signal in response to the rising edge of the clock signal and a test mode select signal; and
a second dividing circuit that is configured to generate the divided second internal clock signal in response to the falling edge of the clock signal and the test mode select signal.

19. An integrated circuit device according to claim 18:
wherein the first dividing circuit comprises a first divider that is responsive to the rising edge of the clock signal and the test mode signal; and
wherein the second dividing circuit comprises a second divider that is responsive to the falling edge of the clock signal and the test mode signal, and a delay element that is responsive to the second divider.

20. An integrated circuit device comprising:
a memory cell array that is configured to output a plurality of data bits in parallel at a first data rate over a corresponding plurality of first data lines;
an output circuit that is configured to serially output the plurality of data bits to an external terminal at the first data rate in a normal mode of operation, and to serially output the plurality of data bits to the external terminal at a second data rate that is lower than the first data rate, in a test mode of operation, the output circuit comprising a multiplexer that is configured to multiplex read data on the first data lines onto a corresponding plurality of second data lines, and an output buffer that is configured to serially output data on the second data lines to the external terminal;
a mode register set that is responsive to a plurality of command signals and is configured to generate first and second test mode signals to place the multiplexer in first and second submodes, respectively, of the test mode of operation;
wherein the multiplexer is configured to couple a respective first data line to a respective second data line in the normal mode of operation, to couple respective even first data lines to respective even second data lines in the first submode of the test mode of operation, and to couple respective odd first data lines to respective odd second data lines in the second submode of the test mode of operation, and comprises;
a first switch that is configured to couple a respective even first data line to a respective even second data line in the first submode;
a second switch that is configured to couple a respective odd first data line to a respective odd second data line in the second submode; and
an equalizing circuit that is configured to couple a respective odd second data line to a respective adjacent even second data line in the first and second submodes.

21. An integrated circuit device, comprising:
a memory cell array that is configured to output a plurality of data bits in parallel at a first data rate over a corresponding plurality of first data lines;
an output circuit that is configured to serially output the plurality of data bits to an external terminal at the first data rate in a normal mode of operation, and to serially output the plurality of data bits to the external terminal at a second data rate that is lower than the first data rate, in a test mode of operation, the output circuit comprising a multiplexer that is configured to multiplex read data on the first data lines onto a corresponding plurality of second data lines, and an output buffer that is configured to serially output data on the second data lines to the external terminal;
a mode register set that is responsive to a plurality of command signals and is configured to generate first and second test mode signals to place the multiplexer in first and second submodes, respectively, of the test mode of operation;
wherein the multiplexer is configured to couple a respective first data line to a respective second data line in the normal mode of operation, to couple a respective first data line to a respective second data line in the first submode of the test mode of operation, and to cross-couple respective odd and even first data lines to respective even and odd second data lines in the second submode of the test mode of operation.

22. An integrated circuit device according to claim 21 wherein the memory cell array is responsive to a clock signal having rising and falling edges, wherein the output buffer is responsive to a first internal clock signal that is generated in response to the rising edge of the clock signal and to a second internal clock signal that is generated in response to the falling edge of the clock signal in the normal mode of operation, and is responsive to only one of the first internal clock signal and the second internal clock signal in the first and second submodes of the test mode of operation.

23. An integrated circuit device according to claim 22 wherein the output buffer comprises:
a corresponding plurality of registers, a respective one of which is configured to store read data from a respective first data line;
a latch that is associated with a respective pair of adjacent registers, a respective latch being configured to latch data from a first adjacent register in response to a first clock signal and to latch data from a second adjacent register in response to a second clock signal; and
a parallel-to-serial converter that is responsive to the latches, to the first and the second internal clock signals in the normal mode of operation, and to only one of the first and second internal clock signals during both the first and second submodes of operation.

24. An integrated circuit device according to claim 12 wherein the multiplexer comprises:
- a first switch that is configured to couple a respective first data line to a respective second data line in the first submode; and
- a second switch that is configured to cross-couple respective odd and even first data lines to respective even and odd second data lines in the second submode.

25. A method of operating an integrated circuit device having a memory cell array that is configured to output a plurality of data bits in parallel at a first data rate, the method comprising:
- serially outputting the plurality of data bits from the memory cell array to an external terminal at the first data rate in a normal mode of operation; and
- serially outputting the plurality of data bits from the memory cell array to the external terminal at a second data rate that is lower than the first data rate in a test mode of operation.

26. A method according to claim 25:
- wherein serially outputting the plurality of data bits from the memory cell array to an external terminal at the first data rate in a normal mode of operation comprises serially outputting the plurality of data bits from the memory cell array to an external terminal at the first data rate in a normal mode of operation, in response to rising and falling edges of a clock signal; and
- wherein serially outputting the plurality of data bits from the memory cell array to the external terminal at a second data rate that is lower than the first data rate in a test mode of operation comprises serially outputting the plurality of data bits from the memory cell array to the external terminal at a second data rate that is lower than the first data rate in a test mode of operation, in response to only one of the rising edge or the falling edge of the clock signal.

27. A method according to claim 25 wherein serially outputting the plurality of data bits from the memory cell array to the external terminal at a second data rate that is lower than the first data rate in a test mode of operation comprises:
- replicating a first portion of the plurality of data bits that are output from the memory cell array in parallel to thereby serially output the first portion of the plurality of data bits to the external terminal at the second data rate that is lower than the first data rate; and
- replicating a second portion of the plurality of data bits that are output from the memory cell array in parallel to thereby serially output the second portion of the plurality of data bits to the external terminal at the second data rate that is lower than the first data rate.

28. A method according to claim 25:
- wherein the memory cell array is responsive to a clock signal having rising and falling edges;
- wherein serially outputting the plurality of data bits from the memory cell array to an external terminal at the first data rate in a normal mode of operation comprises serially outputting the plurality of data bits from the memory cell array to an external terminal at the first data rate responsive to a first internal clock signal that is generated in response to the rising edge of the clock signal and to a second internal clock signal that is generated in response to the falling edge of the clock signal; and
- wherein serially outputting the plurality of data bits from the memory cell array to the external terminal at a second data rate that is lower than the first data rate in a test mode of operation comprises serially outputting the plurality of data bits from the memory cell array to the external terminal at a second data rate that is lower than the first data rate responsive to only one of the first internal clock signal and the second internal clock signal.

29. A method according to claim 25:
- wherein the memory cell array is responsive to a clock signal having rising and falling edges;
- wherein serially outputting the plurality of data bits from the memory cell array to an external terminal at the first data rate in a normal mode of operation comprises serially outputting the plurality of data bits from the memory cell array to an external terminal at the first data rate responsive to a first internal clock signal that is generated in response to the rising edge of the clock signal and to a second internal clock signal that is generated in response to the falling edge of the clock signal; and
- wherein serially outputting the plurality of data bits from the memory cell array to the external terminal at a second data rate that is lower than the first data rate in a test mode of operation comprises serially outputting the plurality of data bits from the memory cell array to the external terminal at a second data rate that is lower than the first data rate responsive alternatingly to the first internal clock signal and the second internal clock signal.

30. A method according to claim 25:
- wherein the memory cell array is responsive to a clock signal having rising and falling edges;
- wherein serially outputting the plurality of data bits from the memory cell array to an external terminal at the first data rate in a normal mode of operation comprises serially outputting the plurality of data bits from the memory cell array to an external terminal at the first data rate responsive to a first internal clock signal that is generated in response to the rising edge of the clock signal and to a second internal clock signal that is generated in response to the falling edge of the clock signal; and
- wherein serially outputting the plurality of data bits from the memory cell array to the external terminal at a second data rate that is lower than the first data rate, in a test mode of operation comprises serially outputting the plurality of data bits from the memory cell array to the external terminal at a second data rate that is lower than the first data rate responsive to a divided first internal clock signal that is generated from the first internal clock signal and to a divided second internal clock signal that is generated from the second internal clock signal.

31. A method according to claim 25:
- wherein the memory cell array is configured to output the plurality of data bits in parallel at the first data rate over a corresponding plurality of first data lines and the memory device is configured to output the plurality of bits in to an output terminal over a corresponding plurality of second data lines;
- wherein serially outputting the plurality of data bits from the memory cell array to an external terminal at the first data rate in a normal mode of operation comprises coupling a respective first data line to a respective second data line in the normal mode of operation; and wherein serially outputting the plurality of data bits from the memory cell array to the external terminal at a second data rate that is lower than the first data rate in a test mode of operation comprises coupling respective even first data lines to respective even second data lines in a first submode of the test mode of operation, and coupling respective odd first data lines to respective odd second data lines in a second submode of the test mode of operation.

32. A method according to claim 25:

wherein the memory cell array is configured to output the plurality of data bits in parallel at the first data rate over a corresponding plurality of first data lines and the memory device is configured to output the plurality of bits in to an output terminal over a corresponding plurality of second data lines;

wherein serially outputting the plurality of data bits from the memory cell array to an external terminal at the first data rate in a normal mode of operation comprises coupling a respective first data line to a respective second data line in the normal mode of operation; and wherein serially outputting the plurality of data bits from the memory cell array to the external terminal at a second data rate that is lower than the first data rate in a test mode of operation comprises coupling a respective first data line to a respective second data line in a first submode of the test mode of operation and cross coupling respective odd and even first data lines to respective even and odd second data lines in a second submode of the test mode of operation.

* * * * *